United States Patent
Takashima et al.

(10) Patent No.: US 9,840,641 B2
(45) Date of Patent: Dec. 12, 2017

(54) SILICONE RESIN LIQUID COMPOSITION

(71) Applicant: Sumitomo Chemical Company, Limited, Tokyo (JP)

(72) Inventors: Masayuki Takashima, Osaka (JP); Gaku Yoshikawa, Osaka (JP); Tsuyoshi Kameda, Sakai (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 15/111,336

(22) PCT Filed: Jan. 24, 2014

(86) PCT No.: PCT/JP2014/052184
§ 371 (c)(1),
(2) Date: Jul. 13, 2016

(87) PCT Pub. No.: WO2015/111229
PCT Pub. Date: Jul. 30, 2015

(65) Prior Publication Data
US 2016/0340549 A1 Nov. 24, 2016

(51) Int. Cl.
| | | |
|---|---|---|
| C08L 83/06 | (2006.01) |
| H01L 23/29 | (2006.01) |
| C09D 183/06 | (2006.01) |
| C08L 83/04 | (2006.01) |
| H01L 33/56 | (2010.01) |
| C08G 77/44 | (2006.01) |
| C08K 3/22 | (2006.01) |
| C08K 3/36 | (2006.01) |

(52) U.S. Cl.
CPC .......... *C09D 183/06* (2013.01); *C08G 77/44* (2013.01); *C08K 3/22* (2013.01); *C08K 3/36* (2013.01); *C08L 83/04* (2013.01); *C08L 83/06* (2013.01); *H01L 23/296* (2013.01); *H01L 33/56* (2013.01); *C08K 2003/2227* (2013.01); *C08K 2003/2237* (2013.01); *C08K 2201/00* (2013.01); *H01L 2933/005* (2013.01)

(58) Field of Classification Search
CPC .................. C08L 83/04; C08L 83/06
See application file for complete search history.

(56) References Cited

U.S. PATENT DOCUMENTS

| 2009/0309195 A1* | 12/2009 | Giraud | ................. | C09D 183/04 257/632 |
|---|---|---|---|---|
| 2010/0280210 A1 | 11/2010 | Kitamura et al. | | |
| 2012/0043577 A1 | 2/2012 | Imazawa et al. | | |
| 2012/0058333 A1 | 3/2012 | Yamamoto et al. | | |
| 2012/0211797 A1 | 8/2012 | Saiki et al. | | |
| 2013/0221400 A1 | 8/2013 | Tanikawa et al. | | |

FOREIGN PATENT DOCUMENTS

| JP | 2011127011 | | 6/2011 |
|---|---|---|---|
| JP | 2011-202154 | A | 10/2011 |
| JP | 2012041496 | A | 3/2012 |
| JP | 2013147633 | A | 8/2013 |
| JP | 2013151581 | A | 8/2013 |
| JP | 2013227446 | | 11/2013 |
| TW | 201132707 | A | 10/2011 |
| WO | 2009/066608 | A1 | 5/2009 |
| WO | 2010/110389 | A1 | 9/2010 |
| WO | 2011083879 | A1 | 7/2011 |
| WO | 2012/046784 | A1 | 4/2012 |
| WO | 2012053301 | A1 | 4/2012 |
| WO | WO 2013/142138 | * | 9/2013 |
| WO | 2013162052 | A1 | 10/2013 |
| WO | 2013180258 | A1 | 12/2013 |

OTHER PUBLICATIONS

Translation of WO 2013/180258 into English (no date).*
Int'l Search Report dated Apr. 22, 2014 in Int'l Application No. PCT/JP2014/052184 (English Translation).
Int'l Preliminary Report on Patentability dated Jul. 26, 2016 in Int'l Application No. PCT/JP2014/052184 (English translation).
Office Action dated Mar. 7, 2017 in JP Application No. 2013-160713.
Office Action dated Apr. 24, 2017 in TW Application No. 10620438780.
Extended Search Report dated Sep. 1, 2017 in EP Application No. 14880195.4.

* cited by examiner

*Primary Examiner* — Marc Zimmer
(74) *Attorney, Agent, or Firm* — Panitch Schwarze Belisario & Nadel LLP

(57) ABSTRACT

A silicone resin liquid composition containing a silicone resin is provided. The $^{29}$Si-NMR measurement of the resin exhibits a ratio of the area of signals assigned to A3 silicon atoms to the area of all signals derived from silicon atoms of 51% to 69%. An A3 silicon atom represents a silicon atom to which are bonded three oxygen atoms bonded to another silicon atom.

17 Claims, 5 Drawing Sheets

SILICONE RESIN LIQUID COMPOSITION

CROSS-REFERENCE TO RELATED APPLICATION

This application is a Section 371 of International Application No. PCT/JP2014/052184, filed Jan. 24, 2014, which was published in the Japanese language on Jul. 30, 2015 under International Publication No. WO 2015/111229 A1, and the disclosure of which is incorporated herein by reference.

TECHNICAL FIELD

The present invention relates to a silicone resin liquid composition.

BACKGROUND ART

In recent years, it has been proposed to use a cured product of a silicone resin composition as an encapsulating material for a semiconductor light-emitting element. However, a cured product of a silicone resin composition has a high gas permeability and a low barrier property against hydrogen sulfide gas in air. For this reason, there has been a problem in that, when encapsulating is made by using a cured product of a silicone resin composition, a silver film which is a back-surface reflection plate of the encapsulated semiconductor light-emitting element is corroded by hydrogen sulfide in air, thereby leading to decrease in the brightness of the semiconductor light-emitting element.

As a silicone resin composition that solves the aforementioned problem, there is proposed a curable silicone resin composition comprising a silicone resin in which the refractive index of the silicone resin composition after curing is 1.50 to 1.55 and a silicon oxide filler having an average particle size of 1 to 10 μm and being homogeneously dispersed at a concentration of 1 to 30 mass % in the silicone resin (See Patent Document 1.).

PRIOR ART DOCUMENT

Patent Document

Patent Document 1: JP-A-2012-41496

SUMMARY OF THE INVENTION

However, in the silicone resin composition disclosed in Patent Document 1, heat resistance, anti-cracking property, and a barrier property against hydrogen sulfide gas were not sufficient.

The present invention has been made in view of the aforementioned problem, and an object thereof is to provide, as an encapsulating material for a semiconductor light-emitting element, a novel silicone resin liquid composition in which the heat resistance, the barrier property against hydrogen sulfide gas, and the anti-cracking property that suppresses cracks at the interface to a substrate or a package of the semiconductor light-emitting element are all high, as well as a cured product of the silicone resin liquid composition, an encapsulating material for a semiconductor light-emitting element comprising the cured product, a semiconductor light-emitting device comprising the cured product, and a method for producing the same.

As a result of eager studies in order to solve the aforementioned problems, the present inventors have reached the present invention as follows.

In other words, one aspect of the present invention provides a silicone resin liquid composition comprising a silicone resin, the $^{29}$Si-NMR measurement thereof affords a ratio of the area of signals assigned to A3 silicon atoms as defined below to the area of all signals derived from silicon atoms of 51% to 69%.

The term "A3 silicon atom" represents a silicon atom to which are bonded three oxygen atoms bonded to another silicon atom.

The term "all signals derived from silicon atoms" represents all signals derived from silicon atoms included in a range of chemical shift of −200 ppm to 100 ppm in $^{29}$Si-NMR measurement.

The silicone resin liquid composition is in a liquid form, and is preferably in a liquid form within a temperature range of 20° C. to 50° C. Further, the silicone resin liquid composition preferably has a fluidity within a temperature range of 20° C. to 50° C.

The viscosity of the silicone resin liquid composition at 25° C. is preferably 10000 mPa·s or less. The viscosity is typically 100 mPa·s or more. The viscosity can be measured with a cylindrical rotational viscometer.

One aspect of the present invention may have a construction in which the silicone resin comprises a resin A as defined below and an oligomer B as defined below.

The resin A is a resin having a ratio of the content of the A3 silicon atoms to the total content of A1 silicon atoms as defined below, A2 silicon atoms as defined below and the A3 silicon atoms of 20% to 90%, and having a weight-average molecular weight of 1500 to 8000.

The oligomer B is an oligomer having a ratio of the content of the A3 silicon atoms to the total content of A1 silicon atoms as defined below, A2 silicon atoms as defined below and the A3 silicon atoms of 0% to 30%, having a weight-average molecular weight of less than 1500.

The term "A1 silicon atom" represents a silicon atom to which is bonded one oxygen atom bonded to another silicon atom. The term "A2 silicon atom" represents a silicon atom to which are bonded two oxygen atoms bonded to another silicon atom.

One aspect of the present invention may have a construction in which the resin A is a resin having an organopolysiloxane structure represented by the formula (1):

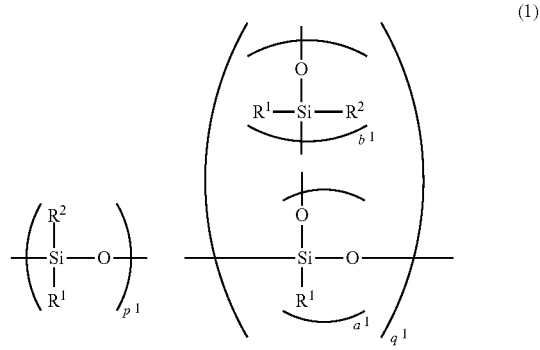

(in the formula (1), $R^1$ each independently represents an alkyl group or an aryl group; $R^2$ each independently represents an alkoxy group, an alkenyl group, a hydrogen atom or a hydroxyl group; and $p^1$, $q^1$, $a^1$ and $b^1$ represent arbitrary positive numbers satisfying $[p^1+b^1\times q^1]:[a^1\times q^1]=1:0.25$ to 9.).

One aspect of the present invention may have a construction in which the oligomer B is an oligomer having an organopolysiloxane structure represented by the formula (2):

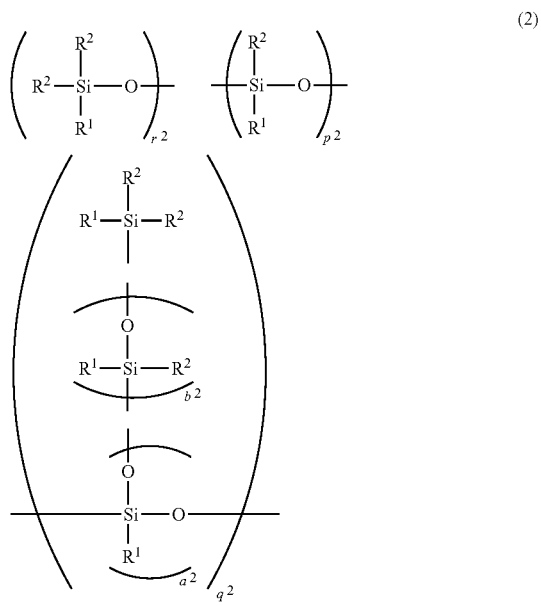

(2)

(in the formula (2), $R^1$ and $R^2$ represent the same meaning as in the formula (1); and $p^2$, $q^2$, $r^2$, $a^2$ and $b^2$ represent arbitrary positive numbers larger than 0 satisfying $[a^2\times q^2]/[(p^2+b^2\times q^2)+a^2\times q^2+(r^2+q^2)]=0$ to 0.3.).

One aspect of the present invention may have a construction in which a mixing ratio of the resin A and the oligomer B is resin A:oligomer B=100:0.1 to 20 (mass ratio).

One aspect of the present invention may have a construction further comprising inorganic particles.

One aspect of the present invention may have a construction in which the inorganic particles are composed of one or more species selected from the group consisting of a silicon oxide, a titanium oxide and an aluminum oxide.

One aspect of the present invention may have a construction further comprising a fluorescent substance.

One aspect of the present invention may have a construction further comprising a silane coupling agent.

One aspect of the present invention may have a construction in which the specific gravity of a cured product produced by raising the temperature of the silicon resin liquid composition from room temperature to 150° C. at a temperature ramp-up rate of 5° C./min and then curing the silicon resin liquid composition by heating it at 150° C. for three hours is within a range of 1.20 g/cm³ to 1.35 g/cm³.

One aspect of the present invention provides a cured product produced by heating the silicone resin liquid composition described above to a temperature of 40° C. to 250° C.

One aspect of the cured product described above may have a construction in which the specific gravity thereof is within a range of 1.20 g/cm³ to 1.35 g/cm³.

One aspect of the present invention provides an encapsulating material for a semiconductor light-emitting element, comprising the cured product described above.

One aspect of the present invention provides a semiconductor light-emitting device comprising the cured product described above.

One aspect of the present invention provides a method for producing a semiconductor light-emitting device, comprising a step of heating the silicone resin liquid composition described above to a temperature of 100° C. to 250° C., thereby curing the composition.

MODE FOR CARRYING OUT THE INVENTION

Figure 1:
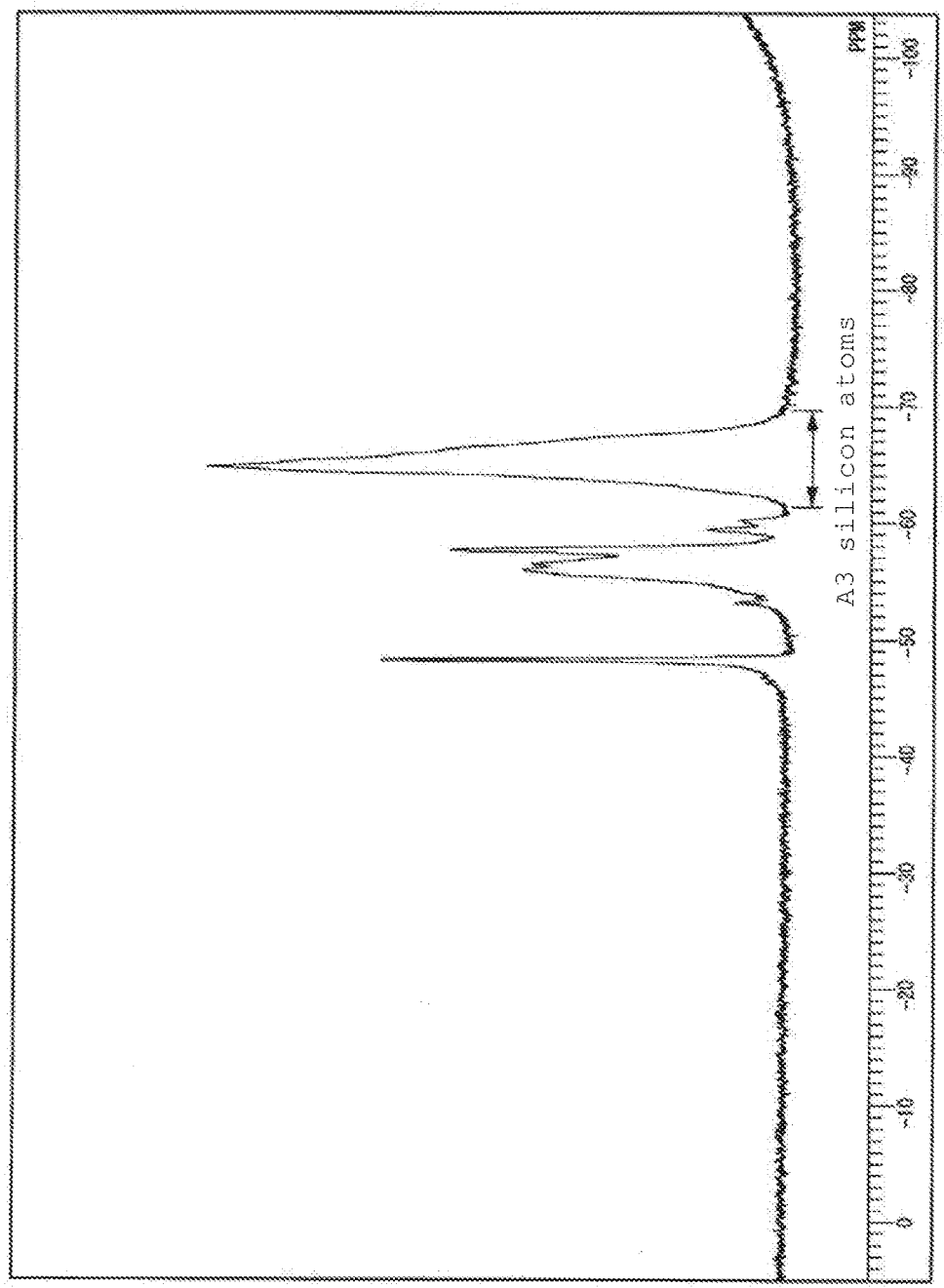
FIG. 1 is a $^{29}$Si-NMR chart of a silicone resin liquid composition (α1) of Example 2.

Hereafter, the present invention will be described in detail. However, the present invention is not limited to the embodiments described below and can be carried out by being modified in various ways within a range of the gist thereof.

[Silicone Resin Liquid Composition]

A silicone resin liquid composition according to the present invention (which may hereafter be referred to as the present composition) is a silicone resin liquid composition comprising a silicone resin, the $^{29}$Si-NMR measurement thereof affords a ratio of the area of signals assigned to A3 silicon atoms as defined below that is contained in the area of all signals derived from silicon atoms of 51% to 69%.

Here, the silicone resin or the oligomer constituting the silicone resin liquid composition of the present specification comprises repeating units represented by the following formulae.

(A1)

(A1')

(A2)

(A3)

(Wherein, $R^1$ represents an alkyl group or an aryl group; and $R^2$ each independently represents an alkoxy group, an alkenyl group, a hydrogen atom or a hydroxyl group.)

In the present specification, a repeating unit comprising three oxygen atoms bonded to another silicon atom and a silicon atom bonded to $R^1$ is referred to as a repeating unit A3 (the above-mentioned formula (A3)).

Similarly, a repeating unit comprising two oxygen atoms bonded to another silicon atom and a silicon atom bonded to $R^1$ and $R^2$ is referred to as a repeating unit A2 (the above-mentioned formula (A2)).

A repeating unit comprising one oxygen atom bonded to another silicon atom and a silicon atom bonded to $R^1$ and two $R^2$ is referred to as a repeating unit A1 (the above-mentioned formula (A1)).

A repeating unit comprising a silicon atom bonded to $R^1$ and two $R^2$, wherein the silicon atom is bonded to an oxygen atom in another repeating unit, is referred to as a repeating unit A1' (the above-mentioned formula (A1')).

In the following description, the "silicon atom to which are bonded three oxygen atoms bonded to another silicon atom" in the present invention is referred to as an "A3 silicon atom". The "A3 silicon atom" corresponds to the silicon atom contained in the repeating unit A3.

The "silicon atom to which are bonded two oxygen atoms bonded to another silicon atom" in the present invention is referred to as an "A2 silicon atom". The "A2 silicon atom" corresponds to the silicon atom contained in the repeating unit A2.

The "silicon atom to which is bonded one oxygen atom bonded to another silicon atom" in the present invention is referred to as an "A1 silicon atom". The "A1 silicon atom" corresponds to the silicon atom contained in the repeating unit A1, A1'.

The repeating units A1 and A1' constitute a terminal end of an organopolysiloxane chain. The repeating unit A3 constitutes a branched chain structure formed by one or two organopolysiloxane chains. In other words, the repeating unit A3 forms a part of a net structure or a cyclic structure of a resin.

In the present composition, when the area of the signals derived from the A3 silicon atoms is within the above range, a cured product of the silicone resin liquid composition (which may hereafter be referred to as the present cured product) is excellent in heat resistance, anti-cracking property, and a barrier property against hydrogen sulfide gas. When the area of the signals derived from the A3 silicon atoms exceeds 69%, cracks are liable to be generated in the present cured product. When the area of the signals derived from the A3 silicon atoms is smaller than 51%, the barrier property against hydrogen sulfide gas and the heat resistance of the present cured product decrease.

The area of the signals derived from the A3 silicon atoms is preferably 55% to 68%.

In the present specification, the area of NMR signals of silicon atoms is calculated based on a NMR chart determined by using $^{29}$Si-NMR.

Specifically, the area of the signals is determined by using an analyzing apparatus generally attached to an apparatus for measuring NMR of silicon atoms and determining an integrated value of the signals constituting an object of measurement.

When the signal derived from each silicon is observed independently without being overlapped with signals derived from other kinds of silicon, the signal area is determined by setting a start point and an end point of integration on a baseline on two sides of the signals corresponding to the silicon constituting an object of measurement.

When the signal derived from each silicon is observed by being overlapped with signals derived from other kinds of silicon, the area of each signal is determined by separating the overlapping signals with use of a waveform separation processing software that is generally attached to the analyzing apparatus. For example, after the plurality of overlapping signals are subjected to waveform separation by using a Gauss function as a fitting function, the signal area is determined by setting a start point and an end point of integration in the same manner as in the above-described case in which the signals are independently observed.

In NMR measurement, the structures and the like of atoms, functional groups and substituents bonded to the silicon atom can be determined by making reference to a known database or literature.

In the present composition, it is preferable that a specific gravity of a cured product produced by raising the temperature of the silicon resin liquid composition from room temperature to 150° C. at a temperature ramp-up rate of 5° C./min and then curing the silicon resin liquid composition by heating it at 150° C. for three hours is within a range of 1.20 g/cm$^3$ to 1.35 g/cm$^3$. The specific gravity is more preferably within a range of 1.23 g/cm$^3$ to 1.30 g/cm$^3$.

When the specific gravity is within the above range, it is preferable because the barrier property against hydrogen sulfide gas becomes more excellent. When the specific gravity exceeds 1.35 g/cm$^3$, cracks are liable to be generated in the present cured product. The specific gravity can be adjusted by changing the content of the silicone resin and the existence ratio of the A3 silicon atoms contained in the present composition.

The specific gravity can be determined generally from the volume and the mass. When the shape of the cured product is amorphous, the specific gravity can be measured with use of a commercially available specific gravity measurement apparatus using the Archimedes method.

The silicone resin can be synthesized by using as a starting material an organic silicon compound corresponding to each of the aforementioned repeating units constituting the silicone resin and having a functional group capable of generating a siloxane bond. The "functional group capable of generating a siloxane bond" may be, for example, a halogen atom, a hydroxyl group or an alkoxy group. For example, organotrihalosilane, organotrialkoxysilane or the like can be used as the starting material for the organic silicon compound corresponding to the repeating unit A3. The silicone resin can be synthesized through reaction by the hydrolysis condensation method using these starting materials in a ratio corresponding to an existence ratio of each repeating unit. By selecting such starting materials, the existence ratio of the A3 silicon atoms and the specific gravity of the present cured product can be adjusted. The silicone resin thus synthesized is industrially commercially available as a silicone resin or an alkoxy oligomer.

The silicone resins contained in the present composition are preferably a resin A and an oligomer B as defined below.

The resin A is a resin having a ratio of the content of the A3 silicon atoms to the total content of the A1 silicon atoms, the A2 silicon atoms and the A3 silicon atoms of 20% to and 90%, and having a weight-average molecular weight of 1500 to 8000. The ratio of the content of the A3 silicon atoms to the total content of the A1 silicon atoms, the A2 silicon atoms and the A3 silicon atoms is preferably 50% to 90%, more preferably 60% to 90%, and further preferably 70% to 85%. The ratio of the content of the A3 silicon atoms can be determined by dividing the area of the signals assigned to the A3 silicon atoms by the total of the area of the signals assigned to the A1 silicon atoms, the area of the signals assigned to the A2 silicon atoms and the area of the signals assigned to the A3 silicon atoms as determined by using $^{29}$Si-NMR measurement.

The oligomer B is an oligomer having a ratio of the content of the A3 silicon atoms to the total content of the A1 silicon atoms, the A2 silicon atoms and the A3 silicon atoms of 0% to 30%, having a weight-average molecular weight of less than 1500. The ratio of the content of the A3 silicon atoms to the total content of the A2 silicon atoms, the A1 silicon atoms and the A3 silicon atoms is preferably 0% to 25%. The ratio of the content of the A3 silicon atoms can be determined by dividing the area of the signals assigned to the A3 silicon atoms by the total of the area of the signals assigned to the A1 silicon atoms, the area of the signals assigned to the A2 silicon atoms and the area of the signals assigned to the A3 silicon atoms as determined by using $^{29}$Si-NMR measurement.

The A3 silicon atoms can constitute a branched chain structure formed by three organopolysiloxane chains, so that the resin A and the oligomer B having an A3 silicon atom can form a net structure or a cyclic structure.

The kind and the existence ratio of the functional groups bonded to the silicon atom in the resin such as the resin A or the oligomer B can be measured, for example, by using the nuclear magnetic resonance spectrometry (NMR method). The measurement method is described in detail in various documents and the like, and exclusive-use measurement apparatus are widely commercially available. Specifically, the kind and the existence ratio of each functional group in the resin can be measured by dissolving the resin constituting the object of measurement into a specific solvent, giving a strong magnetic field and a high-frequency radio wave to the hydrogen atom nucleus or the silicon atom nucleus in the resin, and resonating the nuclear magnetic moment in the atomic nucleus. A method of measuring the hydrogen atom nucleus is referred to as $^{1}$H-NMR, and a method of measuring the silicon atom nucleus is referred to as $^{29}$Si-NMR. As the solvent, heavy chloroform, heavy dimethyl sulfoxide, heavy methanol, heavy acetone, heavy water or the like may be selected in accordance with the kind of various functional groups.

[Resin A]

When $R^1$ is an alkyl group, the alkyl group may be in a straight-chain form or a branched-chain form, or may have a cyclic structure. An alkyl group in a straight-chain form or a branched-chain form is preferable, and an alkyl group in a straight-chain form is more preferable. The number of carbon atoms in the alkyl group is not particularly limited. An alkyl group having 1 to 10 carbon atoms is preferable, and an alkyl group having 1 to 6 carbon atoms is more preferable, and an alkyl group having 1 to 3 carbon atoms is further preferable.

In the alkyl group, one or more hydrogen atoms constituting the group may be substituted with another group. The substituent for the alkyl group may be, for example, an aryl group having 6 to 10 carbon atoms, such as a phenyl group and a naphthyl group, and a phenyl group is preferable.

Specific examples of the alkyl group represented by $R^1$ include non-substituted alkyl groups such as methyl, ethyl, propyl, isopropyl, butyl, isobutyl, tert-butyl, pentyl, neopentyl, hexyl, octyl, nonyl and decyl groups; and aralkyl groups such as phenylmethyl, phenylethyl, and phenylpropyl groups. Among these, methyl, ethyl, propyl and butyl groups are preferable, and methyl, ethyl and isopropyl groups are more preferable.

When $R^1$ is an aryl group, the aryl group is preferably an aryl group having 6 to 10 carbon atoms. In the aryl group, one or more hydrogen atoms constituting the group may be substituted with another group. The substituent for the aryl group may be, for example, an alkyl group having 1 to 6 carbon atoms, such as methyl, ethyl, propyl and butyl group.

Specific examples of the aryl group represented by $R^1$ include non-substituted aryl groups such as phenyl group and naphthyl group; and alkylaryl groups like alkylphenyl groups such as methylphenyl group, ethylphenyl group and propylphenyl group, and a phenyl group is preferable.

$R^2$ each independently represents an alkoxy group, an alkenyl group, a hydrogen atom or a hydroxyl group. Preferably, $R^2$ represents an alkoxy group or a hydroxyl group.

When $R^2$ is an alkoxy group, the alkoxy group may be in a straight-chain form or a branched-chain form, or may have a cyclic structure. An alkoxy group in a straight-chain form or a branched-chain form is preferable, and an alkoxy group in a straight-chain form is more preferable. The number of carbon atoms in the alkoxy group is not particularly limited. An alkoxy group having 1 to 4 carbon atoms is preferable. Specific preferable examples of the alkoxy group represented by $R^2$ include methoxy, ethoxy, propoxy, isopropoxy, butoxy, isobutoxy and tert-butoxy groups, and methoxy, ethoxy and isopropoxy groups are more preferable.

When $R^2$ is an alkenyl group, the alkenyl group may be in a straight-chain form or a branched-chain form, or may have a cyclic structure. An alkenyl group in a straight-chain form or a branched-chain form is preferable, and an alkenyl group in a straight-chain form is more preferable. The number of carbon atoms in the alkenyl group is not particularly limited. An alkenyl group having 2 to 4 carbon atoms is preferable. Specific preferable examples of the alkenyl group represented by $R^1$ include vinyl group (ethenyl group), allyl group (2-propenyl group), 1-propenyl group, isopropenyl group and butenyl group, and vinyl group is more preferable.

It is preferable that the resin A has neither an alkenyl group nor a hydrosilyl group. In other words, the resin A is preferably a resin having neither an alkenyl group nor a hydrogen atom as $R^2$. When the resin A has an alkenyl group or a hydrosilyl group, the barrier property against hydrogen sulfide gas and the heat resistance of the present cured product tend to decrease.

The resin A preferably has an organopolysiloxane structure represented by the following formula (1).

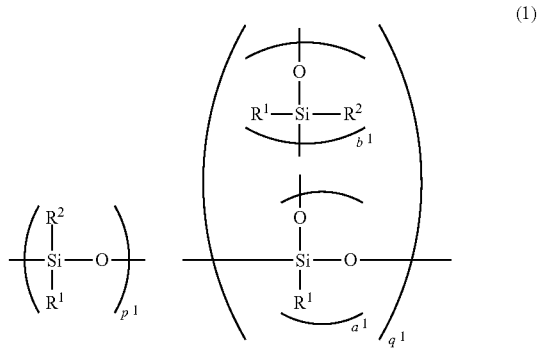

(1)

(Wherein, $R^1$ and $R^2$ represent the same meaning as described above; and $p^1$, $q^1$, $a^1$ and $b^1$ represent arbitrary positive numbers satisfying $[p^1+b^1 \times q^1]:[a^1 \times q^1]=1:0.25$ to 9.)

The plurality of $R^1$ and $R^2$ each may be the same kind of a group, or may be groups different from each other.

The resin A is preferably a resin having an organopolysiloxane structure represented by the formula (1), having, as $R^1$, one of the groups exemplified in the above as preferable alkyl groups and aryl groups, and having as $R^2$ one of the groups exemplified in the above as preferable alkoxy groups or a hydroxyl group. In particular, the resin A is preferably a resin having an organopolysiloxane structure represented by the formula (1), having, as $R^1$, one or more kinds selected from the group consisting of a methyl group, an ethyl group and a phenyl group, and having, as $R^2$, one or more kinds selected from the group consisting of a methoxy group, an ethoxy group, an isopropoxy group and a hydroxyl group. The resin A is more preferably a resin having an organopolysiloxane structure represented by the formula (1), having, as $R^1$, one or more kinds selected from the group consisting of a methyl group and an ethyl group, and having, as $R^2$, one or more kinds selected from the group consisting of a methoxy group, an ethoxy group, an isopropoxy group and a hydroxyl group. The resin A is further preferably a resin having an organopolysiloxane structure represented by the formula (1), having, as $R^1$, one or more kinds selected from the group consisting of a methyl group and an ethyl group, and having, as $R^2$s, a hydroxyl group and one or more kinds selected from the group consisting of a methoxy group, an ethoxy group and an isopropoxy group.

The existence ratio of each repeating unit in the resin represented by the formula (1) can be expressed by the existence ratio of the A2 silicon atoms and the A3 silicon atoms. That is, theoretically, A2 silicon atoms:A3 silicon atoms=$[p^1+b^1 \times q^1]:[a^1 \times q]$. In other words, the existence ratio of the A2 silicon atoms and the A3 silicon atoms in the resin A is adjusted by suitably adjusting the numerical values of $p^1$, $q^1$, $a^1$ and $b^1$.

In the formula (1), $p^1$, $q^1$, $a^1$ and $b^1$ represent arbitrary positive numbers satisfying $[p^1+b^1 \times q^1]:[a^1 \times q^1]=1:0.25$ to 9. In other words, $p^1$, $q^1$, $a^1$ and $b^1$ in the formula (1) are suitably adjusted so that the existence ratio of the number of the A2 silicon atoms ($x^1$) and the number of the A3 silicon atoms ($y^1$) comes to be within a range of $x^1:y^1=1:0.25$ to 9.

The resin A is preferably a silicone resin having an organopolysiloxane structure represented by the formula (1), wherein a content of the A3 silicon atoms to the total content of the A2 silicon atoms and the A3 silicon atoms $[y^1/(x^1+y^1)]$ is within a range of 0.2 to 0.9. A cured product in which the organopolysiloxane chains are configured in a net form can be produced by curing the resin A because the resin A has a high existence ratio of the A3 silicon atoms. When the existence ratio of the A3 silicon atoms is higher than the aforementioned range, the anti-cracking property of the present cured product may in some cases decrease. When the existence ratio of the A3 silicon atoms is lower than the aforementioned range, the barrier property against hydrogen sulfide gas may in some cases decrease.

The cured product of the resin A has a high barrier property against a gas such as hydrogen sulfide because the resin A is a silicone resin having an organopolysiloxane structure in which the existence ratio of the A3 silicon atoms in the above formula (1) is within the aforementioned range. The resin A is preferably a resin in which $[y^1/(x^1+y^1)]$ is within a range of 0.5 to 0.9 ($x^1:y^1=1:1$ to 9), more preferably a resin in which $[y^1/(x^1+y^1)]$ is within a range of 0.6 to 0.9 ($x^1:y^1=1:1.5$ to 9), and further preferably a resin in which $[y^1/(x^1+y^1)]$ is within a range of 0.7 to 0.85 ($x^1:y^1=1:2.33$ to 5.67).

The number of A2 silicon atoms and A3 silicon atoms per one molecule of the resin A is suitably adjusted so that the resin having an organopolysiloxane structure represented by the formula (1) comes to have a desired molecular weight. In the present invention, it is preferable that the total of the number of A2 silicon atoms and the number of A3 silicon atoms per one molecule of the resin A is 5 or more.

The weight-average molecular weight (Mw) of the resin A is 1500 to 8000. When the weight-average molecular weight of the resin A is too small, the barrier property of the present cured product against hydrogen sulfide gas tends to decrease. When the weight-average molecular weight of the resin A is within the above range, a cured product being more excellent in the barrier property against hydrogen sulfide gas can be produced. The weight-average molecular weight of the resin A is preferably 1500 to 7000, more preferably 2000 to 5000.

The resin A can be synthesized by using, as a starting material, an organic silicon compound corresponding to each of the aforementioned repeating units constituting the resin A and having a functional group capable of generating a siloxane bond. The "functional group capable of generating a siloxane bond" represents the same meaning as described above. For example, organotrihalosilane, organotrialkoxysilane or the like can be used as the starting material for the organic silicon compound corresponding to the repeating unit A3. The silicone resin can be synthesized through reaction by the hydrolysis condensation method using these starting materials in a ratio corresponding to an existence ratio of each repeating unit. The silicone resin thus synthesized is industrially commercially available as a silicone resin or an alkoxy oligomer.

[Oligomer B]

$R^1$ and $R^2$ represent the same meaning as described above.

It is preferable that the oligomer B substantially has neither an alkenyl group nor a hydrosilyl group. In other words, it is preferable that the oligomer B has neither an alkenyl group nor a hydrogen atom bonded to a silicon atom as $R^2$. When the oligomer B has an alkenyl group or a hydrosilyl group, the barrier property against hydrogen sulfide gas and the heat resistance of the present cured product tend to decrease.

The oligomer B is preferably an oligomer having an organopolysiloxane structure represented by the formula (2)

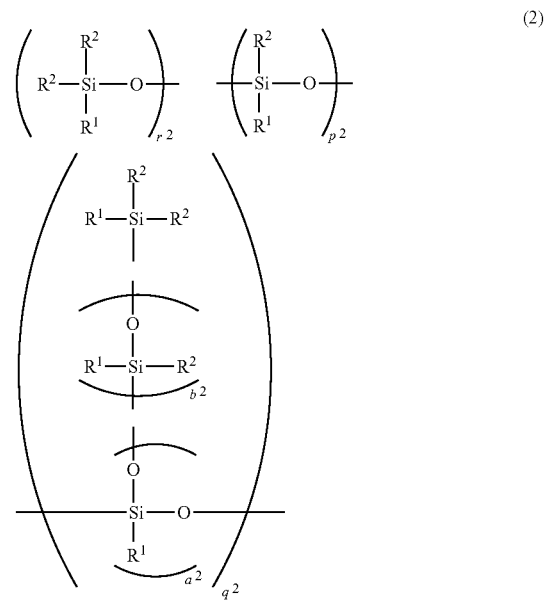

(Wherein, $R^1$ and $R^2$ represent the same meaning as described above; and $p^2$, $q^2$, $r^2$, $a^2$ and $b^2$ represent arbitrary numbers larger than 0 satisfying $[a^2 \times q^2]/[(p^2+b^2 \times q^2)+a^2 \times q^2+(r^2+q^2)]=0$ to 0.3.)

The plurality of $R^1$ and $R^2$ each may each be the same kind of a group, or may be groups different from each other.

The oligomer B is preferably a resin having an organopolysiloxane structure represented by the formula (2), having, as $R^1$, one of the groups exemplified in the above as preferable alkyl groups and aryl groups, and having, as $R^2$, one of the groups exemplified in the above as preferable alkoxy groups, alkenyl groups, a hydrogen atom and a hydroxyl group. In particular, the oligomer B is preferably a resin having an organopolysiloxane structure represented by the formula (2), having, as $R^1$, one or more kinds selected from the group consisting of a methyl group, an ethyl group and a phenyl group, and having, as $R^2$, one or more kinds selected from the group consisting of a methoxy group, an ethoxy group, an isopropoxy group and a hydroxyl group. The oligomer B is more preferably a resin having an organopolysiloxane structure represented by the formula (2), having, as $R^1$, one or more kinds selected from the group consisting of a methyl group and an ethyl group, and having, as $R^2$, one or more kinds selected from the group consisting of a methoxy group, an ethoxy group and an isopropoxy group.

The existence ratio of each repeating unit in the oligomer represented by the formula (2) can be expressed by the existence ratio of the A1 silicon atoms, A2 silicon atoms and the A3 silicon atoms. That is, theoretically, A1 silicon atoms:A2 silicon atoms:A3 silicon atoms=$[r^2+q^2]$:$[p^2+b^2 \times q^2]$:$[a^2 \times q^2]$. In other words, the existence ratio of each silicon atom in the oligomer B can be adjusted by suitably adjusting the numerical values of $p^2$, $q^2$, $r^2$, $a^2$ and $b^2$. For example, when at least one of $a^2$ and $q^2$ is 0, the oligomer B has no A3 silicon atoms and comprises only straight-chain or cyclic molecules. On the other hand, when both of $r^2$ and $q^2$ is 0, the oligomer B has only A2 silicon atoms and comprises only cyclic molecules.

Assuming that the number of A2 silicon atoms is $x^2$; the number of A3 silicon atoms is $y^2$; and the number of A1 silicon atoms is $z^2$ in the formula (2), the existence ratio of the repeating unit A3 silicon atoms in the formula (2) can be represented by $[y^2/(x^2+y^2+z^2)]$.

In the formula (2), $p^2$, $q^2$, $r^2$, $a^2$ and $b^2$ represent arbitrary positive numbers larger than 0 satisfying $[a^2 \times q^2]/[(p^2+b^2 \times q^2)+a^2 \times q^2+(r^2+q^2)]$=0 to 0.3.

$[a^2 \times q^2]/[(p^2+b^2 \times q^2)+a^2 \times q^2+(r^2+q^2)]$ is equal to the existence ratio of the repeating unit A3 silicon atoms in the formula (2), that is, $[y^2/(x^2+y^2+z^2)]$. In other words, $p^2$, $q^2$, $r^2$, $a^2$ and $b^2$ in the formula (2) are suitably adjusted so that the existence ratio of the A3 silicon atoms comes to be within a range of 0 to 0.3.

In other words, the oligomer B contained in the silicone resin liquid composition according to the present invention is preferably a silicone resin having an organopolysiloxane structure represented by the formula (2) and having a weight-average molecular weight (Mw) of less than 1500, wherein the content of the A3 silicon atoms to the total content of the A1 silicon atoms, the A2 silicon atoms and the A3 silicon atoms $[y^2/(x^2+y^2+z^2)]$ is 0 to 0.3. As long as the existence ratio of the A3 silicon atoms is within the aforementioned range, the existence ratio of the A2 silicon atoms $[x^2/(x^2+y^2+z^2)]$ and the existence ratio of the A1 silicon atoms $[z^2/(x^2+y^2+z^2)]$ are not particularly limited. The oligomer B is preferably such that $[y^2/(x^2+y^2+z^2)]$ is within a range of 0 to 0.25, more preferably within a range of 0.05 to 0.2.

The oligomer B has fewer branched-chain structures and comprises a lot of straight-chain or cyclic molecules because the oligomer B has a comparatively low existence ratio of the A3 silicon atoms. The oligomer B may be an oligomer comprising cyclic molecules alone. It is preferable that the oligomer B comprises a lot of straight-chain molecules. For example, the oligomer B is preferably an oligomer in which the aforementioned existence ratio of the A1 silicon atoms $[z^2/(x^2+y^2+z^2)]$ is within a range of 0 to 0.80, more preferably within a range of 0.30 to 0.80, further preferably within a range of 0.35 to 0.75, and further more preferably within a range of 0.35 to 0.55.

The weight-average molecular weight of the oligomer B is less than 1500. When the weight-average molecular weight of the oligomer B is too large, there is a fear that the anti-cracking property of the produced by cured product may become insufficient. The weight-average molecular weight of the oligomer B is preferably 200 or more and less than 1500, more preferably 250 to 1000.

The number of the A1 silicon atoms, the A2 silicon atoms and A3 silicon atoms in one molecule of the oligomer B is suitably adjusted so that the resin having an organopolysiloxane structure represented by the formula (2) comes to have a desired molecular weight. In the present invention, it is preferable that the total of the number of the A1 silicon atoms, the number of the A2 silicon atoms and the number of the A3 silicon atoms in one molecule of the oligomer B is 2 or more.

By curing a substance produced by blending the oligomer B with the resin A, a cured product being excellent in the anti-cracking property and the adhesion can be produced without deteriorating the high gas-barrier property of the resin A. The reason why the anti-cracking property of the resin composition comprising the resin A and the adhesion thereof to other materials are improved by addition of the oligomer B is not clear. It is surmised that, as a result of bonding of the oligomer having a low molecular weight so as to crosslink between molecules of the resin A having a high molecular weight, the flexibility is improved, and also the polarity of the resin as a whole increases by the functional groups in the oligomer, thereby the adhesive force to other materials is improved.

The oligomer B can be synthesized by using, as a starting material, an organic silicon compound corresponding to each of the aforementioned repeating units constituting the oligomer B and having a functional group capable of generating a siloxane bond. The "functional group capable of generating a siloxane bond" represents the same meaning as described above. For example, organotrihalosilane, organotrialkoxysilane or the like can be used as the starting material for the organic silicon compound corresponding to the repeating unit A3. The silicone resin can be synthesized through reaction by the hydrolysis condensation method using these starting materials in a ratio corresponding to an existence ratio of each repeating unit.

In synthesizing the oligomer B, the starting materials are mixed with organic silicon compounds corresponding to the repeating units A1 and A1' described above. The organic silicon compounds corresponding to the repeating units A1 and A1' are bonded to the terminal ends of polymerization reaction to stop the polymerization reaction when the starting materials are polymerized by hydrolysis condensation reaction. For this reason, the oligomer B tends to have a smaller polymerization average molecular weight than the resin A in which the starting materials do not comprise the organic silicon compounds corresponding to the repeating units A1 and A1'.

The difference in weight-average molecular weight from the resin A can also be controlled, for example, by controlling the reaction temperature in subjecting the starting materials to hydrolysis condensation reaction or the speed of adding the starting materials into the reaction system.

The silicone resin thus synthesized is industrially commercially available as a silicone resin or an alkoxy oligomer.

As the weight-average molecular weight (Mw), it is possible to use a value determined generally by the gel permeation chromatography (GPC) method. Specifically, after a resin (or oligomer) is dissolved into a soluble solvent, the resultant is passed together with a mobile-phase solution into a column in which a filler containing a lot of fine holes (pores) is used. Separation is made in accordance with the size of the molecular weight in the column, and this is detected by using a differential refractometer, a UV meter, a viscometer, a light-scattering detector or the like as a detector. In actual cases, a GPC exclusive-use apparatus is widely commercially available, and measurement is generally made by standard polystyrene conversion. The weight-average molecular weight (Mw) in the present invention has been measured by this standard polystyrene conversion.

The solvent to be used for dissolving the resin (or oligomer) is preferably the same solvent as the mobile-phase solvent used in the GPC measurement, and specific examples thereof to be used include tetrahydrofuran, chloroform, toluene, xylene, dichloromethane, dichloroethane, methanol, ethanol and isopropyl alcohol.

The column to be used is also commercially available in many cases, and a specific column may be used in accordance with the presumed molecular weight.

In the present invention and in the specification of the present application, the presence or absence of an alkenyl group or hydrosilyl group in the silicone resin can be determined by measurement using the above $^1$H-NMR, $^{29}$Si-NMR or an infrared spectrophotometer.

The silicone resin liquid composition according to the present invention is produced by preferably mixing the resin A with the oligomer B. It is preferable to mix the oligomer B to the resin A in an amount smaller than the amount of the resin A. In particular, by setting the mixing ratio of the resin A and the oligomer B in the silicone resin liquid composition according to the present invention to be resin A:oligomer B=100:0.1 to 20 (mass ratio), a cured produce being more excellent in the barrier property against hydrogen sulfide gas and the anti-cracking property can be produced. The mixing ratio of the resin A and the oligomer B is preferably resin A:oligomer B=100:0.2 to 15 (mass ratio), more preferably resin A:oligomer B=100:0.5 to 10 (mass ratio).

A method for mixing the resin A and the oligomer B is not particularly limited, so that any of the methods that are generally carried out in mixing two or more kinds of polymers may be used. For example, the resin A and the oligomer B can be mixed by dissolving the resin A and the oligomer B (and other resins in accordance with the needs) into an organic solvent.

Preferably, because more homogeneous mixing can be made and the stability of the resin solution thereafter can be improved, it is preferable that, after the resin A and the like are temporarily dissolved in an organic solvent having a high volatility and solubility, substitution with another solvent is made. Specifically, the resin A is put into an organic solvent having a high volatility (hereafter referred to as organic solvent P), and the resin A and the like are dissolved by heating to a temperature around the boiling point of the organic solvent P and stirring. Subsequently, the oligomer B is put, and is mixed and dissolved in a similar manner. Thereafter, a solvent having a lower volatility than the organic solvent P (hereafter referred to as solvent Q) is put into the solution into which the resin A and the like and the oligomer B have been dissolved. By heating and distilling so that the concentration of the organic solvent P becomes 1% or less, solvent substitution from the organic solvent P to the solvent Q can be made. At that time, as means for more efficiently performing the solvent substitution, heating can be made in a state in which the pressure inside the container is reduced.

By performing such a treatment, the residual solvent used in synthesizing the resin A and the oligomer B, the water remaining without having reacted and the like can be removed in entrainment by performing the solvent substitution. For this reason, such a treatment is effective for stability of the resin solution.

The organic solvent P is preferably an organic solvent having a boiling point of less than 100° C. Specifically, ketone solvents such as acetone and methyl ethyl ketone; alcohol solvents such as methanol, ethanol, isopropyl alcohol and normal propyl alcohol; hydrocarbon solvents such as hexane, cyclohexane, heptane and benzene; acetate solvents such as methyl acetate and ethyl acetate; and ether solvents such as dimethyl ether and tetrahydrofuran are preferable. Among these, alcohol solvents such as methanol, ethanol, isopropyl alcohol and normal propyl alcohol are more preferable.

The solvent Q is preferably an organic solvent having a boiling point of 100° C. or higher. Specifically, glycol ether solvents such as ethylene glycol monomethyl ether, ethylene glycol monoethyl ether, ethylene glycol monoisopropyl ether, ethylene glycol monobutyl ether, ethylene glycol monohexyl ether, ethylene glycol monoethylhexyl ether, ethylene glycol monophenyl ether, ethylene glycol monobenzyl ether, diethylene glycol monomethyl ether, diethylene glycol monoethyl ether, diethylene glycol monoisopropyl ether, diethylene glycol monobutyl ether, diethylene glycol monohexyl ether, diethylene glycol monoethylhexyl ether, diethylene glycol monophenyl ether, diethylene glycol monobenzyl ether, propylene glycol monomethyl ether, propylene glycol monoethyl ether, propylene glycol monoisopropyl ether, propylene glycol monobutyl ether, propylene glycol monohexyl ether, propylene glycol monoethylhexyl ether, propylene glycol monophenyl ether, propylene glycol monobenzyl ether, dipropylene glycol monomethyl ether, dipropylene glycol monoethyl ether, dipropylene glycol monoisopropyl ether, dipropylene glycol monobutyl ether, dipropylene glycol monohexyl ether, dipropylene glycol monoethylhexyl ether, dipropylene glycol monophenyl ether and dipropylene glycol monobenzyl ether; and glycol ester solvents produced by adding an acetic acid group to the glycol ether solvents mentioned above, such as ethylene glycol monoethyl ether acetate, ethylene glycol monoisopropyl ether acetate, ethylene glycol monobutyl ether acetate, ethylene glycol monohexyl ether acetate, ethylene glycol monoethylhexyl ether acetate, ethylene glycol monophenyl ether acetate and ethylene glycol monobenzyl ether acetate are preferable. Among these, ethylene glycol monobutyl ether, diethylene glycol monobutyl ether and ethylene glycol monobutyl ether acetate are more preferable.

[Other Additives]

The present composition preferably further comprises inorganic particles, a fluorescent substance, a silane coupling agent and a catalyst for curing.

(Inorganic Particles, Fluorescent Substance)

When the present cured product is used as an encapsulating material for a semiconductor light-emitting element, the present composition can be used as it is, in order to utilize the light coming from the light-emitting element as it is. In order to raise the intensity of the light coming from the light-emitting element, a fluorescent substance that emits fluorescence by light and inorganic particles can be incorporated into the present composition. The inorganic particles can scatter the light in the present cured product to excite the fluorescent substance effectively, and can prevent the fluorescent substance from precipitating in the resin.

When the fluorescent substance and the inorganic particles are mixed with the present composition, it is effective for preventing precipitation of the fluorescent substance to a further extent that the inorganic particles are mixed in advance before mixing the fluorescent substance that is liable to precipitate, and thereafter, after mixing the fluorescent substance, the resultant is quickly subjected to encapsulating of the semiconductor light-emitting element.

Preferable examples of the inorganic particles include oxides of silicon, titanium, zirconium, aluminum, iron, zinc, and the like, carbon black, barium titanate, calcium silicate and calcium carbonate. Among these, oxide of silicon, oxide of titanium and oxide of aluminum are more preferable.

The inorganic particles may have a generally spherical shape, a plate shape, a columnar shape, a needle shape, a whisker shape, a fibrous shape or the like, and any of these shapes may be adopted. The inorganic particles preferably have a generally spherical shape because the present composition that is more homogeneous can be produced.

The inorganic particles contained in the present composition may be of one species or of two or more species. When the inorganic particles are contained in the present composition, it is preferable that two or more species of inorganic particles having different particle sizes are contained. For example, it is preferable that inorganic particles A in which the average particle size of the primary particles is 100 nm to 500 and inorganic particles B in which the average particle size of the primary particles is less than 100 nm are contained. When the present composition comprises two or more species of inorganic particles different in the average particle size of the primary particles, the excitation efficiency of the fluorescent substance by scattering of light is improved to a further extent, and the effect of preventing precipitation of the fluorescent substance can be exhibited.

The average particle size of the primary particles can be determined by the imaging method or the like that observes the particles directly with an electron microscope or the like. Specifically, the average particle size of the primary particles can be obtained as follows. Liquid obtained by sufficiently dispersing the inorganic particles serving as an object of measurement into an arbitrary solvent by radiating a supersonic wave or the like is dropwise put onto a slide glass or the like and dried. Alternatively, the inorganic particles are allowed to adhere onto an adhesion surface of an adhesive tape by directly sprinkling the inorganic particles onto the adhesion surface or the like process. Thereafter, the particles are directly observed with a scanning electron microscope (SEM), a transmission electron microscope (TEM) or the like, and the dimension is calculated from the shape thereof, thereby obtaining the average particle size of the primary particles.

The content of the inorganic particles in the present composition is not particularly limited. The total content of the inorganic particles is preferably 0.01 to 100 parts by mass, more preferably 0.1 to 50 parts by mass, relative to 100 parts by mass of the content of the silicone resin.

The composition or the kind of the fluorescent substance incorporated into the present composition is not particularly limited. The present composition can comprise a red fluorescent substance that emits fluorescence within a wavelength range of 570 nm to 700 nm, a green fluorescent substance that emits fluorescence within a wavelength range of 490 nm to 570 nm, a blue fluorescent substance that emits fluorescence within a wavelength range of 420 nm to 480 nm, and the like. A plurality of fluorescent substances can be mixed in accordance with the brightness and the chromaticity.

Also, the content of the fluorescent substance in the present composition is not particularly limited, so that the ratio can be suitably adjusted in accordance with the amount of light of the light-emitting element or the chromaticity and the brightness that are needed in the semiconductor light-emitting element.

(Silane Coupling Agent)

The silane coupling agent provides an effect of improving adhesion between the present cured product and the semiconductor light-emitting element or the package. The silane coupling agent is preferably a silane coupling agent having at least one selected from the group consisting of vinyl group, epoxy group, styryl group, methacryl group, acryl group, amino group, ureido group, mercapto group, sulfide group and isocyanate group. Among these, a coupling agent having an epoxy group or a mercapto group is preferable. Specifically, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, 3-mercaptopropylmethyldimethoxysilane and 3-mercaptopropyltrimethoxysilane are preferable.

When the present composition comprises the silane coupling agent, the silicon atoms contained in the silane coupling agent are also detected as signals of $^{29}$Si-NMR. However, in the present invention, it is assumed that the signals of the silane coupling agent are also included in calculating the signal area of the present composition.

The content of the silane coupling agent in the present composition is preferably 0.0001 to 1.0 part by mass, more preferably 0.001 to 0.1 part by mass, relative to 100 parts by mass of the content of the silicone resin. When the content of the silane coupling agent is larger than the above range, transparency of the present cured product may in some cases decrease because the silane coupling agent itself absorbs light.

The silane coupling agent may be used by being mixed with the present composition. Alternatively, the silane coupling agent may be used in a method of allowing the silane coupling agent to adhere onto the surface of the semiconductor light-emitting element or the package by coating or an immersion treatment in advance and thereafter forming the present composition by potting or the like and curing the present composition.

(Catalyst for Curing)

The catalyst for curing is not particularly limited as long as the catalyst can promote the cross-linking reaction of the silicone resin component. When the functional group (the above $R^2$) in the resin A and the oligomer B is an alkoxy group or a hydroxyl group, it is possible to use an inorganic acid such as hydrochloric acid, sulfuric acid, nitric acid or phosphoric acid; or an organic acid such as formic acid, acetic acid, oxalic acid, citric acid, propionic acid, butyric acid, lactic acid, or succinic acid as the catalyst for curing in order to promote the hydrolysis condensation reaction. As the catalyst for curing, it is possible to use an alkaline compound in addition to an acidic compound. Specific examples of the alkaline compounds that can be used include ammonium hydroxide, tetramethylammonium hydroxide and tetraethylammonium hydroxide.

When the functional group (the above $R^2$) in the resin A and the oligomer B is an alkenyl group or a hydrogen atom, a platinum-based, palladium-based or rhodium-based metal catalyst is used in order to promote the hydrosilylation reaction. Specifically, in the case of a platinum-based metal catalyst, it is possible to use a platinum-based catalyst such an platinum, platinum black or platinic chloride, for example, $H_2PtCl_6.mH_2O$, $K_2PtCl_6$, $KHPtCl_6.mH_2O$, $K_2PtCl_4$, $K_2PtCl_4.mH_2O$, $PtO_2.mH_2O$ (m is a positive integer) or a complex of these with a hydrocarbon such as an olefin, an alcohol or a vinyl-containing organopolysiloxane.

In order that the catalyst for curing may be added at a predetermined concentration, the catalyst for curing can be added to the silicone resin liquid composition in a state in which the catalyst for curing is diluted with water, an organic solvent, a silicone-based monomer or an alkoxysilane oligomer that is easily blended with the silicone resin liquid composition.

The amount of the catalyst for curing that is added into the present composition can be suitably adjusted in consideration of the heating temperature at the time of curing reaction, the reaction time, the kind of the catalyst and the like. The content of the catalyst for curing is preferably 0.01 to 20 parts by mass, more preferably 0.01 to 10 parts by mass, relative to 100 parts by mass of the present composition. The catalyst for curing may be added into the present composition just before performing the curing reaction, or else the present composition may originally comprise the catalyst for curing. Preferably, the catalyst for curing is added into the present composition just before performing the curing reaction.

(Other Additives)

The present composition may further comprise a silicone compound different from the resin A and the oligomer B, and an additive.

Examples of the silicone compound different from the resin A and the oligomer B include:

an oligomer having a ratio of the content of the A3 silicon atoms to the total content of the A1 silicon atoms, the A2 silicon atoms and the A3 silicon atoms of more than 30% and 90% or less, and having a weight-average molecular weight of less than 1500, an oligomer having a ratio of the content of the A3 silicon atoms to the total content of the A1 silicon atoms, the A2 silicon atoms and the A3 silicon atoms of more than 90%, and having a weight-average molecular weight of less than 1500, a resin having a ratio of the content of the A3 silicon atoms to the total content of the A1 silicon atoms, the A2 silicon atoms and the A3 silicon atoms of 0% or more and less than 20%, and having a weight-average molecular weight of 1500 or more and 8000 or less, a resin having a ratio of the content of the A3 silicon atoms to the total content of the A1 silicon atoms, the A2 silicon atoms and the A3 silicon atoms of more than 90%, and having a weight-average molecular weight of 1500 to 8000, a resin having a ratio of the content of the A3 silicon atoms to the total content of the A1 silicon atoms, the A2 silicon atoms and the A3 silicon atoms of 0% or more and less than 30%, and having a weight-average molecular weight of more than 8000 and 15000 or less, a resin having a ratio of the content of the A3 silicon atoms to the total content of the A1 silicon atoms, the A2 silicon atoms and the A3 silicon atoms of 30% to 90%, and having a weight-average molecular weight of more than 8000 and 15000 or less, a resin having a ratio of the content of the A3 silicon atoms to the total content of the A1 silicon atoms, the A2 silicon atoms and the A3 silicon atoms of 0% or more and less than 30%, and having a weight-average molecular weight exceeding 15000, a resin having a ratio of the content of the A3 silicon atoms to the total content of the A1 silicon atoms, the A2 silicon atoms and the A3 silicon atoms of 30% to 90%, and having a weight-average molecular weight of more than 15000, and a resin having a ratio of the content of the A3 silicon atoms to the total content of the A1 silicon atoms, the A2 silicon atoms and the A3 silicon atoms of more than 90%, and having a weight-average molecular weight of more than 8000.

The silicone compound may be, for example, a general silicone compound that is industrially commercially available. By adding the silicone for reforming, softness can be imparted to the present cured product.

When the present composition comprises the silicone compound, the silicon atoms contained in the silicone compound are also detected as signals of $^{29}$Si-NMR. However, in the present invention, it is assumed that the signals of the silicone compound are also included in calculating the signal area of the present composition.

The content of the silicone for reforming in the present composition is preferably 0.1 to 20 parts by mass, more preferably 0.5 to 10 parts by mass, relative to 100 parts by mass of the content of the silicone resin. When the content of the silicone for reforming is larger than the above range, transparency of the present cured product may in some cases be deteriorated.

The aforementioned additive may be, for example, a defoaming agent for suppressing air bubbles that are generated at the time of mixing the present composition or the like.

(Cured Product)

The present composition can be cured.

Typically, in order that the present composition is cured, the present composition is heated.

The heating temperature is preferably 40 to 250° C. The heating time is typically 5 minutes to 6 hours. In order to cure the present composition, it is preferable to add the catalyst for curing.

Preferable conditions for curing the present composition are, for example, a method of heating at 40 to 250° C. for 5 minutes to 6 hours. It is preferable to cure the present composition by adding the catalyst for curing into the present composition and thereafter leaving the resultant mixture to stand in an atmosphere having a temperature of 250° C. or lower, more preferably leaving the resultant mixture to stand in an atmosphere having a temperature of 40 to 200° C. In curing the present composition, the present composition may be cured by adjusting the temperature and the time in a stepwise manner, for example, at 40 to 60° C. for 5 to 30 minutes, then at 60 to 100° C. for 10 to 60 minutes, and thereafter at 140 to 200° C. for 30 minutes to 5 hours, in order to remove the solvent and water existing in the present composition and to control the speed of condensation reaction of the silicone resin.

In order to allow the curing reaction to proceed efficiently, it is preferable to comprise a step of heating within a temperature range of 100 to 250° C. The period of time for heating within a temperature range of 100 to 250° C. is typically 1 to 5 hours.

In the present cured product, the gas barrier property is exhibited by forming a network structure as a whole in which the silicon atoms are bonded to other silicon atoms via one or more atoms. For example, the network structure is formed by forming a siloxane bond in which an oxygen atom bonded to a silicon atom is further bonded to another silicon atom, or by crosslinking between two silicon atoms with a carbon atom.

When an oxygen atom bonded to a silicon atom is bonded to a hydrogen atom to form a silanol group without being further bonded to another silicon atom, the network structure is not formed at the site where the silanol group has been formed. For this reason, the amount of the remaining silanol groups may be evaluated in order to grasp the physical properties of the present cured product.

Such an amount of the silanol groups can be evaluated as a ratio of the mass of the silanol groups to the total mass of the present cured product. Hereafter, such a ratio is referred to as "silanol content". The unit for the silanol content is mass %.

The silanol content can be determined in the following manner.

First, the solid $^{29}$Si-NMR spectrum of the present cured product is measured, and the ratio of the signal area derived from the silanol to the total signal area in the obtained spectrum is calculated. This allows that the ratio of the silicon atoms contained in the silanol groups to the total silicon atoms contained in the present cured product can be determined. When the obtained NMR spectrum contains a lot of noise, a smoothing treatment may be carried out, for example, by a method of subjecting the obtained spectrum to Fourier transform and, after removing a high-frequency component of 100 Hz or more, performing an inverse Fourier transform.

Meanwhile, the content (mass %) of silicon contained in the present cured product can be determined by performing inductively coupled high-frequency plasma spectrometry on the present cured product.

From a product of these measurement results, the "mass ratio of silicon atoms constituting the silanol groups to the total mass of the present cured product" (mass %) can be determined.

By multiplying the resultant mass ratio with 45/28 (=(sum of the atomic weights of Si, O, and H)/(atomic weight of Si)), the mass ratio of the silanol groups to the total mass of the present cured product, that is, the "silanol content", can be determined. The determined silanol content can be used for evaluation of the present cured product.

The present cured product produced by curing the present composition has a high gas-barrier property against hydrogen sulfide gas, a high heat-resistance, and a high anti-cracking property, so that the present cured product is useful as an encapsulating material for a semiconductor light-emitting element, a photodiode, a CCD, a CMOS or the like, and in particular, is useful as an encapsulating material for a semiconductor light-emitting element.

A semiconductor light-emitting device comprising a semiconductor light-emitting element encapsulated with the present cured product can be produced by encapsulating the semiconductor light-emitting element on a substrate with the present composition and thereafter curing the present composition. The present cured product has a high adhesion to the substrate or the package, and also has a high barrier property against hydrogen sulfide gas. For this reason, the semiconductor light-emitting device comprising the semiconductor light-emitting element sealed with the present cured product hardly generates cracks or peeling-off at the interface to the substrate or the package, and also hardly generates color change of the silver film which is a back-surface reflection plate of the semiconductor light-emitting element, thereby providing an advantage such that the decrease in brightness with lapse of time is hardly generated. The semiconductor light-emitting device has a good light-emitting brightness and can also be used for general illumination.

Specifically, the semiconductor light-emitting device can be produced by performing a thermal curing reaction after encapsulating the semiconductor light-emitting element on the substrate with the present composition. A method for encapsulating the semiconductor light-emitting element is not particularly limited. For example, the semiconductor light-emitting element can be encapsulated through covering the semiconductor light-emitting element with the present composition by dropwise putting the present composition onto the semiconductor light-emitting element surface or by coating the semiconductor light-emitting element surface with the present composition. Alternatively, the semiconductor light-emitting element can also be encapsulated by curing the present composition in a sheet form in advance and sticking the cured sheet onto the semiconductor light-emitting element surface or the like process.

EXAMPLES

Hereafter, the present invention will be specifically described by showing Examples and Comparative Examples. However, the present invention is not limited to the following Examples.

As means for measuring the kind and the existence ratio of the resin A or the oligomer B having organopolysiloxane as a main chain, which was used in the following Examples, the $^1$H-NMR method and the $^{29}$Si-NMR method were used. For measurement of the molecular weight of the resin A or the oligomer B, the GPC method was used. The measurement conditions in each of the measurement methods are as follows.

<$^1$H-NMR Measurement Conditions>
Apparatus name: ECA-500 manufactured by JEOL RESONANCE Inc.
Observation nucleus: $^1$H
Observation frequency: 500.16 MHz
Measurement temperature: room temperature
Measurement solvent: DMSO-d6
Pulse width: 6.60 μsec (45°)
Pulse repeating time: 7.0 sec
Accumulation times: 16 times
Sample concentration (sample/measurement solvent): 300 mg/0.6 ml
<$^{29}$Si-NMR Measurement Conditions>
Apparatus name: 400-MR manufactured by Agilent Technologies Japan, Ltd.
Observation nucleus: $^{29}$Si
Observation frequency: 79.42 MHz
Measurement temperature: room temperature
Measurement solvent: CDCl$_3$
Pulse width: 8.40 μsec (45°)
Pulse repeating time: 15.0 sec
Accumulation times: 4000 times
Sample concentration (sample/measurement solvent): 300 mg/0.6 ml
<Conditions for GPC Measurement of Resin A>
Apparatus: HLC-8220 manufactured by TOSOH CORPORATION
Column: TSKgel Multipore HXL-M×3+Guard column-MP (XL)
Flow rate: 1.0 mL/min, Detection conditions: RI (polarity +)
Concentration: 100 mg+5 mL (THF)
Injection amount: 100 μL
Column temperature: 40° C.
Eluent: THF
<Conditions for GPC Measurement of Oligomer B>
Apparatus: HLC-8220 manufactured by TOSOH CORPORATION
Column: TSKgel G2000HHR×2+G1000HHR×2
Flow rate: 1.0 mL/min,
Detection conditions: RI (polarity −)
Concentration: 100 mg+5 mL (THF)
Injection amount: 200 μL
Column temperature: 40° C.
Eluent: THF
<Method for Measuring Specific Gravity of Silicone Resin Cured Product>
Apparatus name: electronic specific gravimeter MDS-300 manufactured by Alfa Mirage Co., Ltd.
Liquid used: water
Measurement temperature: 24° C.
Calculation formula: $\rho = A/(A-B) \times \rho 0$ was used
  ρ: specific gravity of cured resin (unit: g/cm³)
  A: weight of cured resin in air (unit: g)
  B: weight of cured resin in liquid (unit: g)
  ρ0: specific gravity of liquid (unit: g/cm³)
(Level 1)
<Preparation Example of Resin>

Example 1

A resin composition was produced by using a resin 1 having an organopolysiloxane structure represented by the above formula (1) (Mw=3500, in the above formula (1), $R^1$=methyl group, $R^2$=methoxy group or hydroxyl group) as the resin A and a resin 2 having an organopolysiloxane structure represented by the above formula (2) (Mw=450, in the above formula (2), $R^1$=methyl group, $R^2$=methoxy group) as the oligomer B. The existence ratio of each of the repeating units of the resin 1 and the resin 2 as determined by measuring $^{29}$Si-NMR is shown respectively in Tables 1 and 2.

Specifically, 354 g of the above resin 1 and 190 g of isopropyl alcohol were put into a flask that had been placed in an oil bath. The temperature was raised until the liquid temperature became 85° C., and the mixture was stirred so as to dissolve the resin 1 sufficiently into isopropyl alcohol. Subsequently, 35 g of the above resin 2 was put, and the mixture was stirred for no less than one hour to dissolve the resin 2. Thereafter, 123 g of 2-butoxyethyl acetate and 0.1 g of 3-glycidoxypropyltrimethoxysilane (silane coupling agent) were added to the resultant resin composition. Thereafter, the resultant mixture was set in an evaporator. The mixture was left to stand under conditions in which the temperature of the mixture was 70° C. and the pressure was 4 kPaA, so as to distill off the isopropyl alcohol until the isopropyl alcohol concentration in the resin composition became 1 mass % or less. By this process, a silicone resin liquid composition in which the mixing ratio of the resin A and the oligomer B was resin A:oligomer B=100:10 was produced.

Comparative Example 1

A silicone resin liquid composition comprising the resin A alone as a polymer component was produced by the same operation as in Example 1 except that the putting of the oligomer B was omitted.

<Preparation of Silicone Resin Liquid Composition Comprising Catalyst for Curing>

With respect to each of the silicone resin liquid compositions produced in Example 1 and Comparative Example 1, 1 part by mass of a mixture of 15% of phosphoric acid and an alkoxysilane represented by the following formula (3) (n=positive number of 3 to 7) was added as a catalyst for curing to 100 parts by mass of the silicone resin liquid composition, followed by stirring and mixing sufficiently, thereby producing a silicone resin liquid composition comprising the catalyst for curing.

TABLE 1

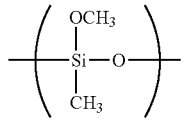

| Repeating unit | $\left(\begin{array}{c} OCH_3 \\ \vert \\ -Si-O- \\ \vert \\ CH_3 \end{array}\right)$ | $\left(\begin{array}{c} OH \\ \vert \\ -Si-O- \\ \vert \\ CH_3 \end{array}\right)$ | $\left(\begin{array}{c} Si \\ \vert \\ O \\ \vert \\ -Si-O- \\ \vert \\ CH_3 \end{array}\right)$ |
|---|---|---|---|
| Existence ratio | 0.08 | 0.15 | 0.77 |

TABLE 2

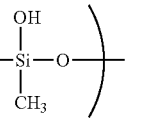

| Repeating unit | $\left(\begin{array}{c} OCH_3 \\ \vert \\ H_3CO-Si-O- \\ \vert \\ CH_3 \end{array}\right)$ | $\left(\begin{array}{c} OCH_3 \\ \vert \\ -Si-O- \\ \vert \\ CH_3 \end{array}\right)$ | $\left(\begin{array}{c} Si \\ \vert \\ O \\ \vert \\ -Si-O- \\ \vert \\ CH_3 \end{array}\right)$ |
|---|---|---|---|
| Existence ratio | 0.39 | 0.49 | 0.12 |

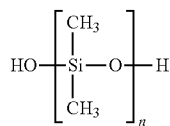

(3)

<Cracking Resistance Evaluation>

Evaluation of the cracking resistance was carried out on the produced silicone resin liquid composition comprising the catalyst. Specifically, a film of the silicone resin liquid composition comprising the catalyst was formed on a non-alkali glass substrate by spin-coating so that the film thickness would be 50 μm. The glass substrate after forming the film was left to stand in an oven having a temperature of 40° C. for 10 minutes and subsequently in an oven having a temperature of 160° C. for 3 hours, thereby curing the resin.

Thereafter, the glass substrate taken out from the oven was observed, with a result that the film (resin cured film) produced by thermally curing the silicone resin liquid composition produced in Example 1 did not have cracks and was good. In contrast, cracks had been generated in the film (resin cured film) produced by curing the silicone resin liquid composition produced in Comparative Example 1.

<Sulfide Resistance Evaluation>

Evaluation of the sulfide resistance (barrier property against hydrogen sulfide gas) was carried out on the produced silicone resin liquid composition comprising the catalyst. Specifically, first, a non-alkali glass substrate (silver film glass substrate) was prepared in which a chrome film having a film thickness of 10 nm had been formed, and a silver film having a film thickness of 100 nm had been formed thereon. Further, each of the silicone resin liquid compositions comprising the catalyst was applied thereon by spin-coating under conditions such that the film thickness would be 20 μm, followed by a thermal treatment at 40° C. for 10 minutes and a subsequent thermal treatment at 160° C. for 3 hours to form a resin cured film on the silver film.

This silver film glass substrate on which the resin cured film had been formed and a silver film glass substrate on which no film had been formed were left to stand for 90 minutes in a closed environment with a hydrogen sulfide concentration of 2 to 6 ppm, a temperature of 85 to 90° C., and a relative humidity of 90% or more.

As a result of this, the silver film of the silver film glass substrate on which no film had been formed was found to have undergone color change to black due to corrosion by hydrogen sulfide. In contrast, the silver film of the silver film glass substrate on which the substance produced by adding a catalyst for curing to each of the silicone resin liquid compositions produced in Example 1 and Comparative Example 1 had been applied to form a film was found to have undergone no color change at all.

(Level 2)

Example 2

A silicone resin liquid composition (α1) was produced by mixing a resin (A-1) having an organopolysiloxane structure represented by the above formula (1) (Mw=3500, in the above formula (1), $R^1$=methyl group, $R^2$=methoxy group or hydroxyl group) (hereafter referred to as resin (A-1)) and an oligomer (B-1) having an organopolysiloxane structure represented by the above formula (2) (Mw=450, in the above formula (2), $R^1$=methyl group, $R^2$=methoxy group) (hereafter referred to as oligomer (B-1)).

The existence ratio of the repeating units of the resin (A-1) is shown in Table 3. The existence ratio of the repeating units of the oligomer (B-1) is shown in Table 4.

TABLE 3

| Repeating unit | $\left(\begin{array}{c}OCH_3\\|\\-Si-O-\\|\\CH_3\end{array}\right)$ | $\left(\begin{array}{c}OH\\|\\-Si-O-\\|\\CH_3\end{array}\right)$ | $\left(\begin{array}{c}Si\\|\\O\\|\\-Si-O-\\|\\CH_3\end{array}\right)$ |
|---|---|---|---|
| Existence ratio | 0.08 | 0.15 | 0.77 |

TABLE 4

| Repeating unit | $\left(\begin{array}{c}OCH_3\\|\\H_3CO-Si-O-\\|\\CH_3\end{array}\right)$ | $\left(\begin{array}{c}OCH_3\\|\\-Si-O-\\|\\CH_3\end{array}\right)$ | $\left(\begin{array}{c}Si\\|\\O\\|\\-Si-O-\\|\\CH_3\end{array}\right)$ |
|---|---|---|---|
| Existence ratio | 0.39 | 0.49 | 0.12 |

The existence ratio of the repeating units of the resin (A-1) and the oligomer (B-1) was determined by measuring $^{29}$Si-NMR on the resin (A-1) and the oligomer (B-1) under the measuring conditions described above.

In the resin (A-1), a ratio of the content of the A3 silicon atoms to the total content of the A1 silicon atoms, the A2 silicon atoms and the A3 silicon atoms, as determined by the definition given in the present specification, is 77%.

A ratio of the content of the A2 silicon atoms and the content of the A3 silicon atoms is [content of A2 silicon atoms]:[content of A3 silicon atoms]=1:3.35.

In the oligomer (B-1), a ratio of the content of the A3 silicon atoms to the total content of the A1 silicon atoms, the A2 silicon atoms and the A3 silicon atoms, as determined by the definition given in the present specification, is 12%.

Specifically, 311 g of the above resin (A-1) and 190 g of isopropyl alcohol were added into a flask that had been placed in an oil bath. The mixture was heated and stirred until the inner temperature became 85° C., so as to dissolve the resin (A-1). Subsequently, 78 g of the above oligomer (B-1) was added to the mixture after dissolution, and the resultant was stirred for no less than one hour to dissolve the oligomer (B-1), thereby producing a mixture.

To the produced mixture, 123 g of 2-butoxyethyl acetate and 0.1 g of 3-glycidoxypropyltrimethoxysilane (silane coupling agent) were added. Thereafter, with use of an evaporator, isopropyl alcohol was distilled off under conditions with a temperature of 70° C. and a pressure of 4 kPaA until the isopropyl alcohol concentration became 1 mass % or less, thereby yielding a silicone resin liquid composition ($\alpha 1$) in which the mixing ratio of the resin (A-1) and the oligomer (B-1) was 80:20.

As a result of $^{29}$Si-NMR measurement of the produced silicone resin liquid composition ($\alpha 1$), the ratio of the area of the signals derived from the A3 silicon atoms to the total signals derived from the silicon atoms was found to be 60%. FIG. 1 shows a $^{29}$Si-NMR chart of the silicone resin liquid composition ($\alpha 1$). The silicone resin liquid composition ($\alpha 1$) contained neither an alkenyl group nor a hydrosilyl group.

To 100 parts by mass of the silicone resin liquid composition ($\alpha 1$), 1 part by mass of a catalyst for curing comprising 15% of phosphoric acid was added, followed by stirring and mixing sufficiently, thereby producing a silicone resin liquid composition ($\alpha 1$-1). Thereafter, about 5 g of the produced silicone resin liquid composition ($\alpha 1$-1) was put into a cup made of aluminum. Further, the temperature was raised from room temperature up to 150° C. at a speed of 5° C./minute in an oven, and the resultant was left to stand at 150° C. for 3 hours, thereby producing a cured product of the silicone resin liquid composition ($\alpha 1$-1). The specific gravity of the produced cured product was 1.27.

Example 3

To 190 g of isopropyl alcohol, 354 g of the resin (A-1), which was put to use in Example 2, was added, and the mixture was heated and stirred until the inner temperature became 85° C., so as to dissolve the resin (A-1) into isopropyl alcohol. Subsequently, 35 g of the oligomer (B-1), which was also put to use in Example 2, was added to the mixture after dissolution. Thereafter, 3.8 g of a commercially available silicone compound, which was different from the resin A and the oligomer B in the present specification, was added, and the resultant was stirred for no less than one hour to dissolve the oligomer (B-1) and the silicone compound.

The silicone compound that was put to use is a resin having a ratio of the content of the A3 silicon atoms to the total content of the A1 silicon atoms, the A2 silicon atoms and the A3 silicon atoms of 0% or more and less than 30%, having a weight-average molecular weight of more than 8000.

Thereafter, a treatment similar to that of Example 2 was carried out, thereby producing a silicone resin liquid composition ($\alpha 2$) in which a mixing ratio of the resin (A-1) and the oligomer (B-1) was 100:10.

Figure 2:
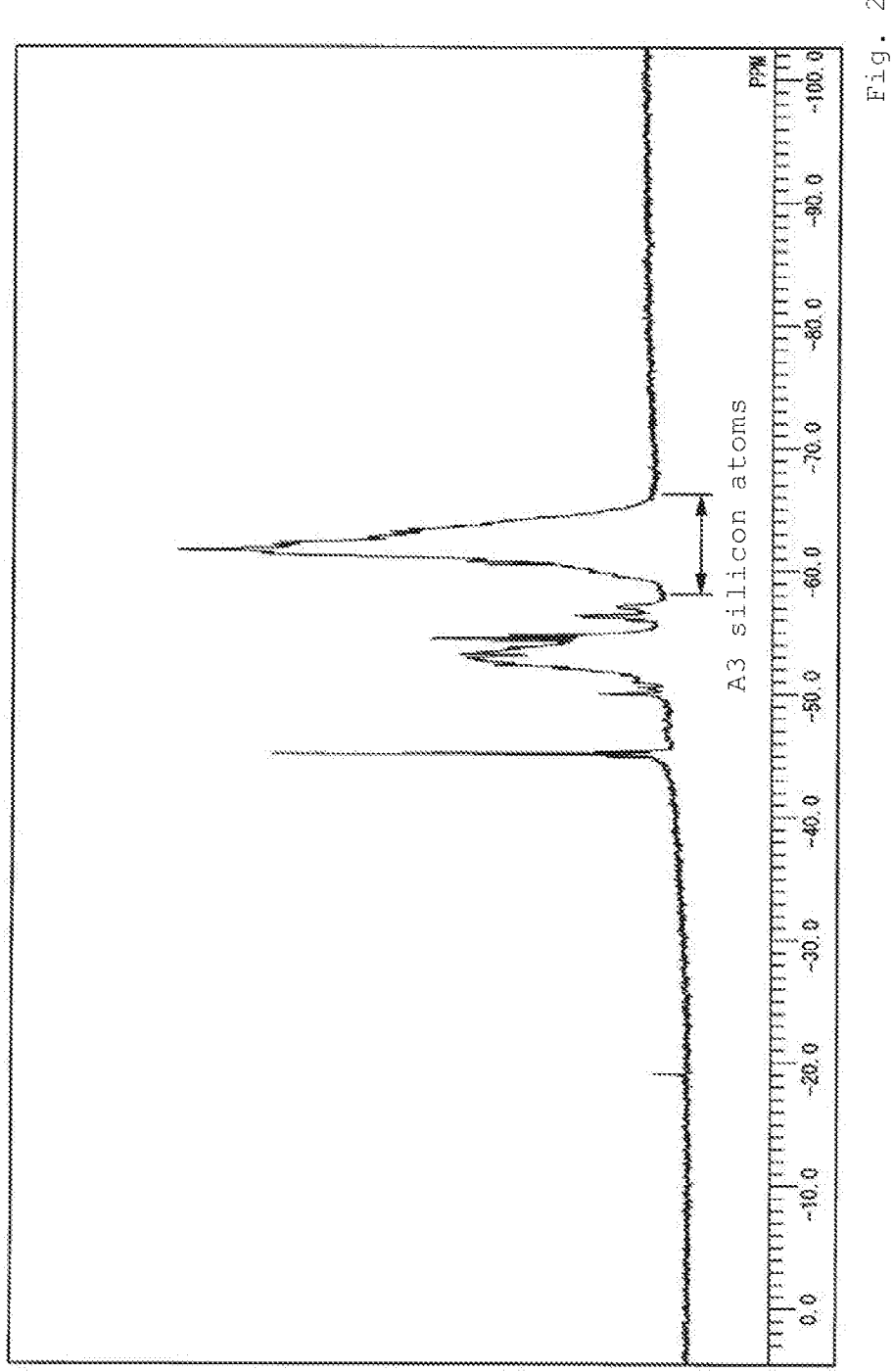
FIG. 2 is a $^{29}$Si-NMR chart of a silicone resin liquid composition (α2) of Example 3.

As a result of $^{29}$Si-NMR measurement of the produced silicone resin liquid composition ($\alpha 2$), the ratio of the area of the signals derived from the A3 silicon atoms to the total signals derived from the silicon atoms was found to be 65%. FIG. 2 shows a $^{29}$Si-NMR chart of the silicone resin liquid composition ($\alpha 2$). The silicone resin liquid composition ($\alpha 2$) contained neither an alkenyl group nor a hydrosilyl group.

To 100 parts by mass of the silicone resin liquid composition ($\alpha 2$), 2 parts by mass of a catalyst for curing comprising 15% of phosphoric acid was added, and thereafter, a cured product of the silicone resin liquid composition was produced under the same conditions as in Example 2. The specific gravity of the produced cured product was 1.26.

Comparative Example 2

A silicone resin X1 (Mw=5100) represented by the following formula (A) and a silicone resin X2 (Mw=2100) represented by the following formula (B) were mixed at a ratio of X1:X2=1:4 (mass ratio), and a catalyst comprising platinum was added thereto, thereby producing a silicone resin liquid composition ($\beta 1$).

Figure 3:
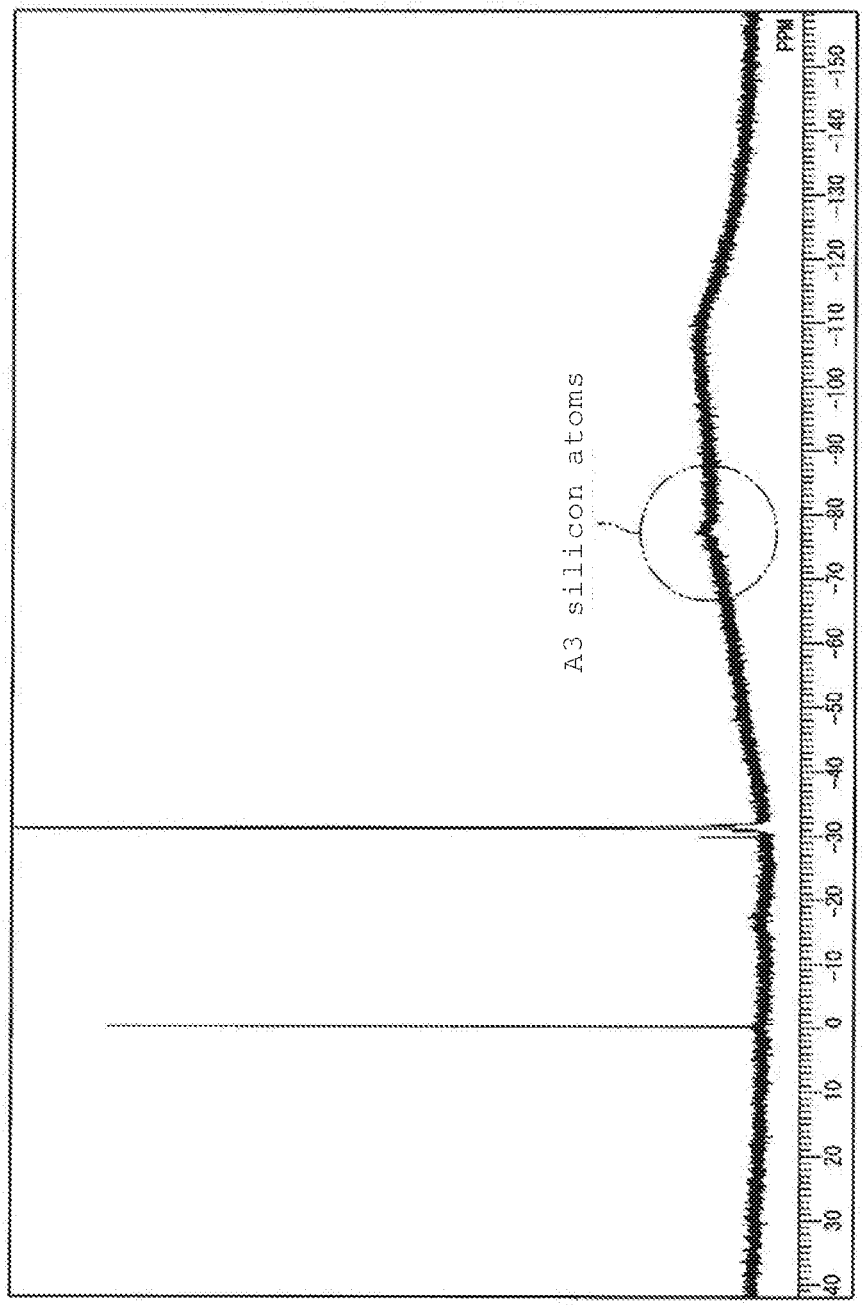
FIG. 3 is a $^{29}$Si-NMR chart of a silicone resin X1 of Comparative Example 2.

As a result of $^{29}$Si-NMR measurement of the silicone resin X1, the ratio of the area of the signals derived from the A3 silicon atoms to the total signals derived from the silicon atoms was found to be 8%. FIG. 3 shows a $^{29}$Si-NMR chart of the silicone resin X1.

Figure 4:
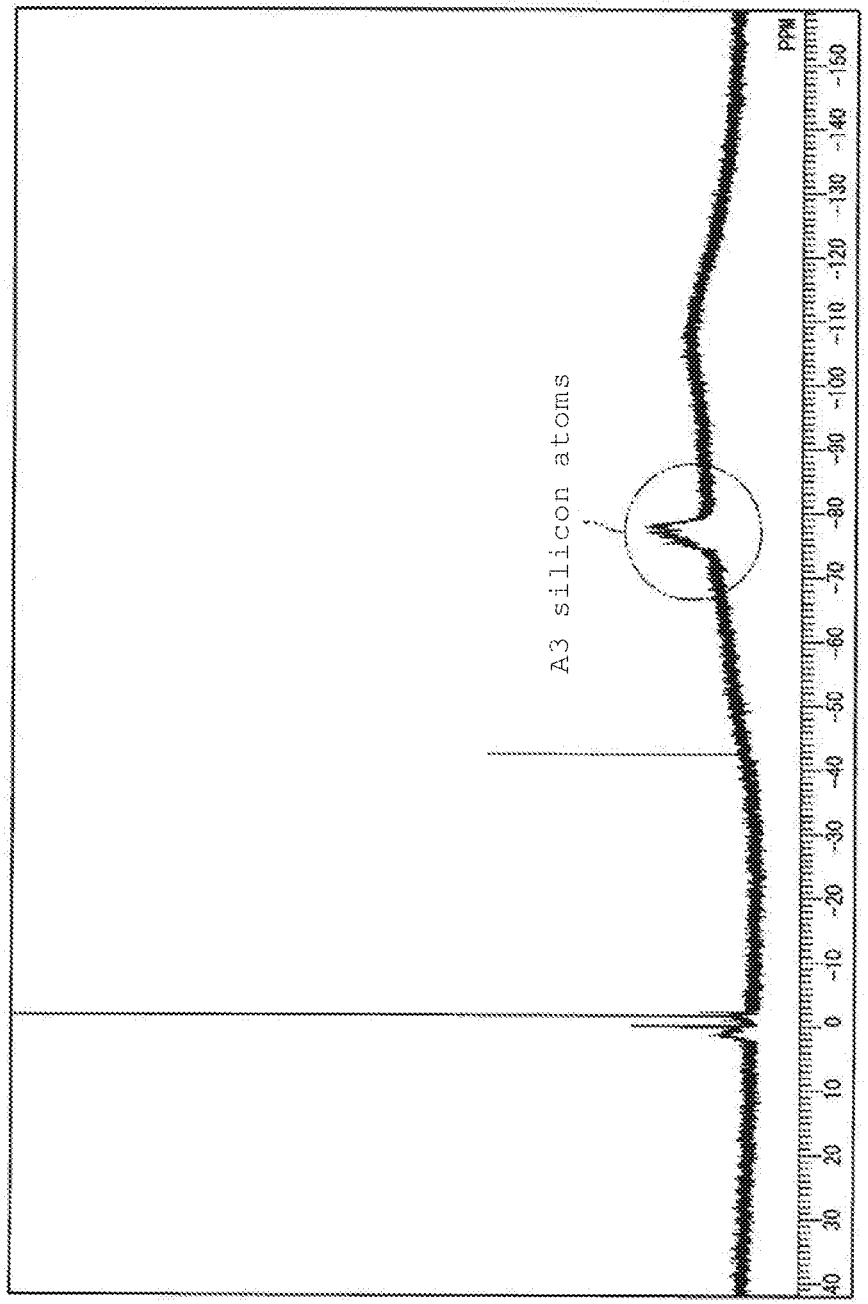
FIG. 4 is a $^{29}$Si-NMR chart of a silicone resin X2 of Comparative Example 2.

As a result of $^{29}$Si-NMR measurement of the silicone resin X2, the area of the signals derived from the A3 silicon atoms among the total signals derived from the silicon atoms was found to be 60%. FIG. 4 shows a $^{29}$Si-NMR chart of the silicone resin X2.

The area of the signals derived from the A3 silicon atoms among the total signals derived from the silicon atoms in the produced silicone resin liquid composition ($\beta 1$) was calculated to be 50% based on the mixing ratio of the silicone resin X1 represented by the formula (A) and the silicone resin X2 represented by the formula (B).

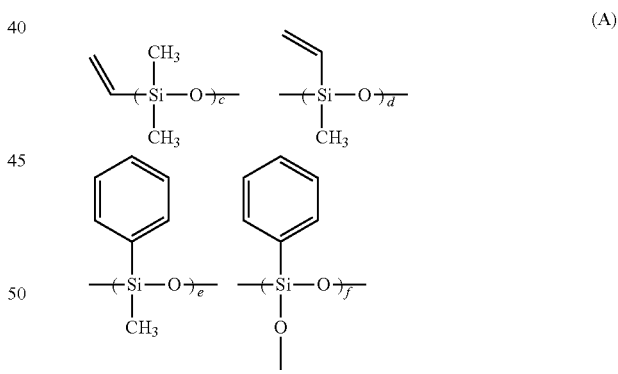

(A)

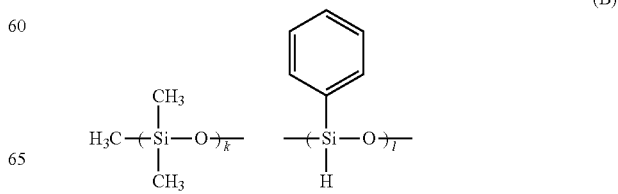

(B)

(Wherein, c, d, e and f represent integers showing the number of units of each repeating unit.)

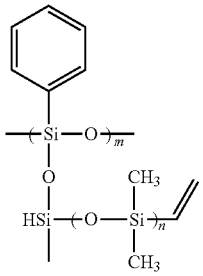

(Wherein, k, l, m and n represent integers showing the number of units of each repeating unit.)

Into a cup made of aluminum, about 5 g of the silicone resin liquid composition (β1) was put, and the temperature was raised from room temperature up to 150° C. at a speed of 5° C./minute in an oven. Further, the temperature was kept at 150° C. for 4 hours, thereby producing a cured product of the silicone resin liquid composition (β1). The specific gravity of the obtained cured product was 1.18.

<Sulfide Resistance Evaluation 1>

Evaluation of the barrier property against hydrogen sulfide gas was carried out on the silicone resin liquid composition (α1-1), the silicone resin liquid composition (α2) and the silicone resin liquid composition (β1).

Specifically, first, a non-alkali glass substrate (silver film glass substrate) was prepared in which a chrome film having a film thickness of 10 nm had been formed, and a silver film having a film thickness of 100 nm had been formed thereon. Further, each of the silicone resin liquid compositions was applied thereon by spin-coating under conditions such that the film thickness would be 20 μm, and a film of a cured product of the silicone resin liquid composition was formed on the silver film by performing a thermal treatment under the same conditions as in the production of the cured product of the silicone resin liquid composition in Example 2.

Two sheets of the silver film glass substrate on which the film of the cured product of the silicone resin liquid composition had been formed in this manner and one sheet of a glass substrate equipped with a silver film on which no film of the cured product of the silicone resin liquid composition had been formed were left to stand for 90 minutes in an environment with a hydrogen sulfide gas concentration of 2 to 6 ppm, a temperature of 85 to 90° C., and a relative humidity of 90% or more.

As a result of this, the silver film on which the film of the cured product of the silicone resin liquid composition (α1-1) or the silicone resin liquid composition (α2) had been formed showed little change as compared with the time before being left to stand. In contrast, the silver film on which the film of the cured product of the silicone resin liquid composition (β1) had been formed and the silver film on which no film of the cured product had been formed were found to have undergone color change to black due to corrosion by hydrogen sulfide.

<Sulfide Resistance Evaluation 2>

The barrier property against hydrogen sulfide gas was evaluated on the silicone resin liquid composition (α2).

Specifically, the silicone resin liquid composition (α2) was dropwise put onto a commercially available package SMD-3602B made of resin for a semiconductor light-emitting element in which a reflection film of silver had been formed by plating at the bottom of the package (manufactured by Panasonic Industrial Devices Discrete Semiconductor (Suzhou) Co., Ltd.) so as to cover the reflection film of silver completely. Thereafter, a cured product of the silicone resin liquid composition was fabricated in the package by performing a thermal treatment under the same conditions as in the production of the cured product of the silicone resin liquid composition in Example 2.

The package produced in this manner was left to stand for 5 hours in a closed environment with a hydrogen sulfide concentration of 2 to 6 ppm, a temperature of 85 to 90° C., and a relative humidity of 90% or more.

As a result of this, in the package in which the silicone resin liquid composition (α2) had been cured, the reflection film of silver at the bottom of the package showed little change.

<Heat Resistance Evaluation>

Evaluation of heat resistance was carried out on the silicone resin liquid composition (α1), the silicone resin liquid composition (α2) and the silicone resin liquid composition (β1).

Specifically, a cured product of each of the silicone resin liquid compositions was produced by performing a thermal treatment under the same conditions as in the production of the cured product of the silicone resin liquid composition in Example 2 except that the liquid amount was adjusted so as to attain a thickness of 1 mm. The cured products were taken out from the cup made of aluminum, and the transmittance was measured at the wavelengths of 400 nm and 350 nm. Subsequently, these cured products were left to stand for 60 hours in an oven of 200° C., and thereafter the transmittance was measured again at the same wavelengths. The results are shown in Table 5.

The transmittance of the cured products of the silicone resin liquid composition (α1) and the silicone resin liquid composition (α2) to each wavelength showed little change between before and after being left to stand at 200° C. In contrast, the cured product of the silicone resin liquid composition (β1) showed a considerable change in transmittance. Also, with regard to the outer appearance of the cured products, the cured product of the silicone resin liquid composition (α2) was transparent both before and after being left to stand at 200° C. In contrast, although the cured product of the silicone resin liquid composition (β1) was transparent before being left to stand at 200° C., the cured product of the silicone resin liquid composition (β1) was found to have undergone a little color change to yellow after being left to stand at 200° C., and was inferior in the heat resistance in an environment of 200° C.

TABLE 5

| | Before being left to stand at 200° C. | | After being left to stand at 200° C. | |
|---|---|---|---|---|
| | 400 nm | 350 nm | 400 nm | 350 nm |
| α1 | 91.8% | 91.2% | 92.4% | 91.1% |
| α2 | 91.5% | 91.0% | 92.1% | 91.2% |
| β1 | 85.7% | 82.7% | 77.8% | 48.9% |

Comparative Example 3

A silicone resin liquid composition (β3) comprising the resin (A-1) alone as a silicone resin component was produced by the same operation as in Example 2 except that the oligomer (B-1) was not added.

As a result of $^{29}$Si-NMR measurement of the produced silicone resin liquid composition (β3), the area of the signals derived from the A3 silicon atoms among the total signals derived from the silicon atoms was found to be 70%.

Figure 5:
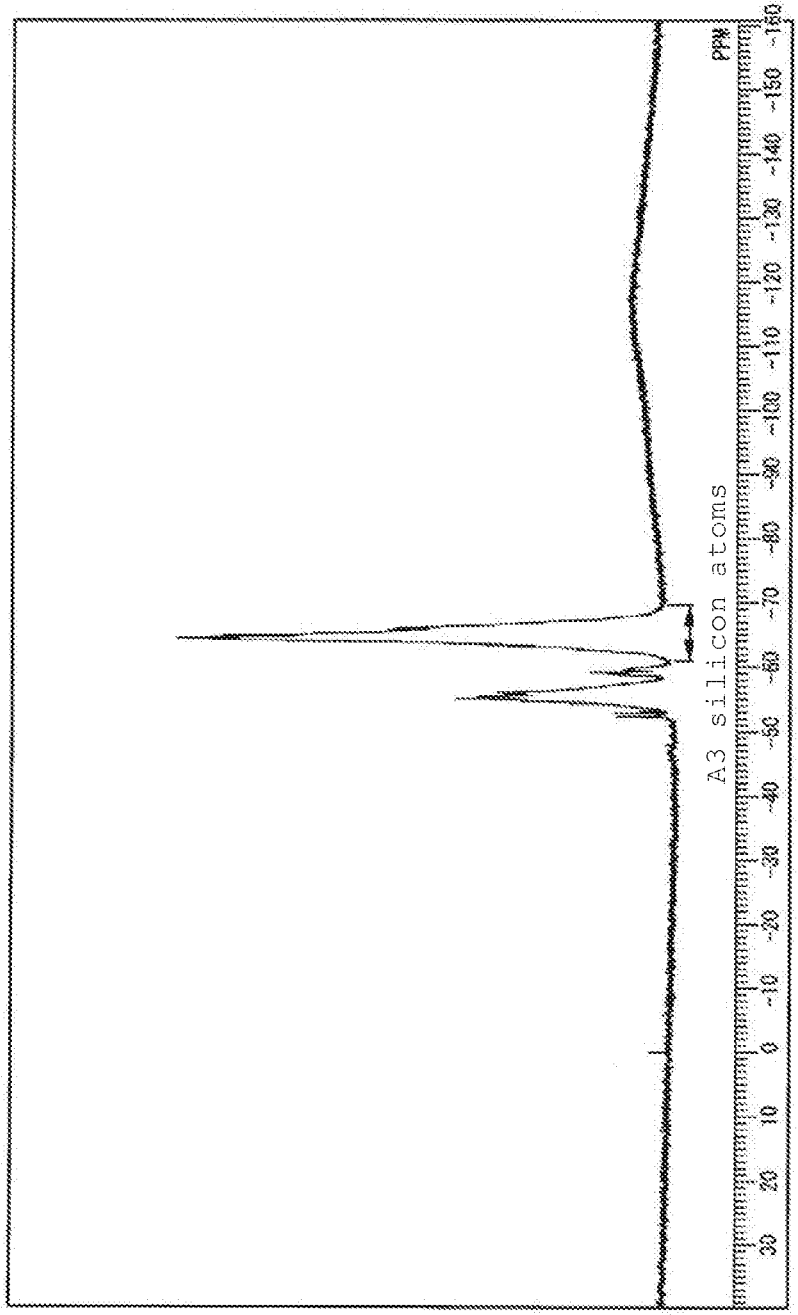
FIG. 5 is a $^{29}$Si-NMR chart of a silicone resin liquid composition (β3) of Comparative Example 3.

FIG. 5 shows a $^{29}$Si-NMR chart of the silicone resin liquid composition (β3). The silicone resin liquid composition (β3) contained neither an alkenyl group nor a hydrosilyl group.

To 100 parts by mass of the silicone resin liquid composition (β3), 2 parts by mass of a catalyst for curing comprising 15% of phosphoric acid was added, and thereafter, a cured product of the resin composition was produced under the same conditions as in Example 2. The specific gravity of the obtained cured product was 1.28.

<Anti-cracking Property Evaluation>

Evaluation of an anti-cracking property was carried out on the silicone resin liquid composition (α1-1), the silicone resin liquid composition (α2) and the silicone resin liquid composition (β3).

Specifically, each of these silicone resin liquid compositions was dropwise put into a commercially available package SMD-3602B made of resin for a semiconductor light-emitting element so that the inside of the container would be almost fully filled. Thereafter, the resultant was left to stand in an oven having a temperature of 40° C. for 10 minutes and subsequently in an oven having a temperature of 150° C. for 3 hours, thereby producing a cured product of each of the silicone resin liquid compositions.

Thereafter, the package taken out from the oven was observed, with a result that the cured products of the silicone resin liquid composition (α1-1) and the silicone resin liquid composition (α2) did not have cracks and were good. In contrast, cracks had been generated in the cured product of the silicone resin liquid composition (β3).

The silicone resin liquid composition according to the present invention has a high barrier property against hydrogen sulfide gas and a high heat-resistance at a high temperature such as 200° C., and further is excellent in anti-cracking property at the time of curing, so that the silicone resin liquid composition is extremely effective as an encapsulating material of a semiconductor light-emitting element.

INDUSTRIAL APPLICABILITY

The silicone resin liquid composition according to the present invention gives a cured product of the silicone resin liquid composition being excellent in heat resistance, anti-cracking property, and a barrier property against hydrogen sulfide gas. For this reason, the cured product of the silicone resin liquid composition according to the present invention is useful as an encapsulating material for a semiconductor light-emitting element.

The invention claimed is:

1. A silicone resin liquid composition comprising a silicone resin,
the $^{29}$Si-NMR measurement thereof affords a ratio of the area of signals assigned to A3 silicon atoms as defined below to the area of all signals derived from silicon atoms of 51% to 69%,
where said A3 silicon atom represents a silicon atom to which are bonded three oxygen atoms bonded to another silicon atom,
wherein the silicone resin comprises a resin A as defined below and an oligomer B as defined below,
where said resin A is a resin having a ratio of the content of the A3 silicon atoms to the total content of A1 silicon atoms as defined below, A2 silicon atoms as defined below and the A3 silicon atoms of 20% to 90%, and having a weight-average molecular weight of 1500 to 8000;
said oligomer B is an oligomer having a ratio of the content of the A3 silicon atoms to the total content of A1 silicon atoms as defined below, A2 silicon atoms as defined below and the A3 silicon atoms of 0% to 30%, having a weight-average molecular weight of less than 1500,
where said A1 silicon atom represents a silicon atom to which is bonded one oxygen atom bonded to another silicon atom;
said A2 silicon atom represents a silicon atom to which are bonded two oxygen atoms bonded to another silicon atom, and
wherein a mixing mass ratio of the resin A and the oligomer B is resin A : oligomer B=100:0.1 to 20.

2. The silicone resin liquid composition according to claim 1, wherein the resin A is a resin having an organopolysiloxane structure represented by the formula (1):

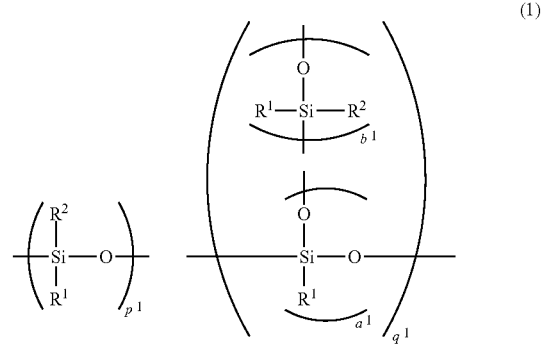

(1)

in the formula (1), $R^1$ each independently represents an alkyl group or an aryl group; $R^2$ each independently represents an alkoxy group, an alkenyl group, a hydrogen atom or a hydroxyl group; and $p^1$, $q^1$, $a^1$ and $b^1$ represent arbitrary positive numbers satisfying $[p^1+b^1 \times q^1]:[a^1 \times q^1]=1:0.25$ to 9.

3. The silicone resin liquid composition according to claim 1, wherein the oligomer B is an oligomer having an organopolysiloxane structure represented by the formula (2):

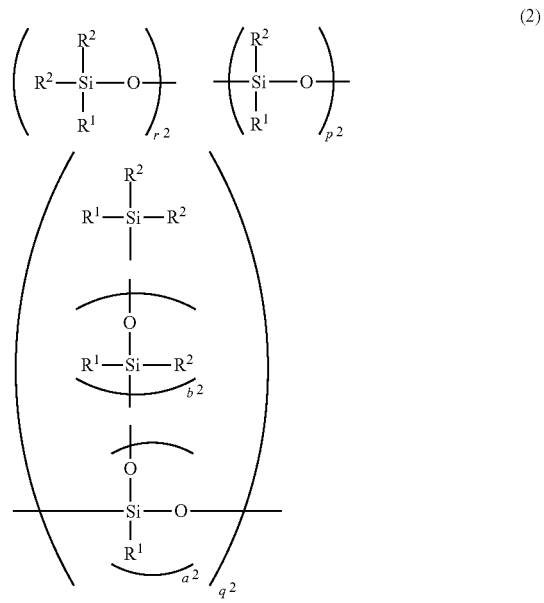

(2)

in the formula (2), $R^1$ and $R^2$ represent the same meaning as in the formula (1); and $p^2$, $q^2$, $r^2$, $a^2$ and $b^2$ represent arbitrary positive numbers larger than 0 satisfying $[a^2 \times q^2]/[(p^2+b^2 \times q^2)+a^2 \times q^2+(r^2+q^2)]=0$ to 0.3.

4. The silicone resin liquid composition according to claim 1, further comprising inorganic particles.

5. The silicone resin liquid composition according to claim 4, wherein the inorganic particles are composed of one or more species selected from the group consisting of a silicon oxide, a titanium oxide and an aluminum oxide.

6. The silicone resin liquid composition according to claim 1, further comprising a fluorescent substance.

7. The silicone resin liquid composition according to claim 1, further comprising a silane coupling agent.

8. The silicone resin liquid composition according to claim 1, wherein the specific gravity of a cured product produced by raising the temperature of the silicon resin liquid composition from room temperature to 150° C. at a temperature ramp-up rate of 5° C./min and then curing the silicon resin liquid composition by heating it at 150° C. for three hours is within a range of 1.20 g/cm³ to 1.35 g/cm³.

9. A cured product produced by heating the silicone resin liquid composition according to claim 1 to a temperature of 40° C. to 250° C.

10. The cured product according to claim 9, wherein the specific gravity thereof is within a range of 1.20 g/cm³ to 1.35 g/cm³.

11. An encapsulating material for a semiconductor light-emitting element, comprising the cured product according to claim 9.

12. A semiconductor light-emitting device comprising the cured product according to claim 9.

13. A method for producing a semiconductor light-emitting device, comprising a step of heating the silicone resin liquid composition according to claim 1 to a temperature of 40° C. to 250° C., thereby curing the composition.

14. The silicone resin liquid composition according to claim 2, wherein $R^2$ in the formula (1) is an alkoxy group or a hydroxyl group.

15. The silicone resin liquid composition according to claim 3, wherein $R^2$ in the formula (2) is an alkoxy group or a hydroxyl group.

16. The silicone resin liquid composition according to claim 2, wherein the oligomer B is an oligomer having an organopolysiloxane structure represented by the formula (2):

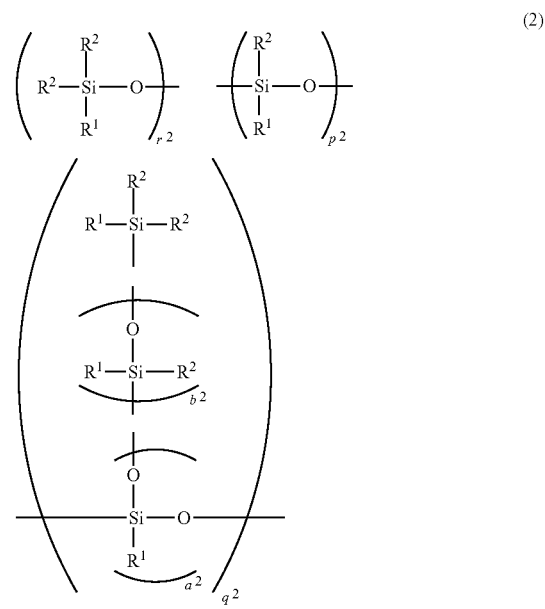

in the formula (2), $R^1$ and $R^2$ represent the same meaning as in the formula (1); and $p^2$, $q^2$, $r^2$, $a^2$ and $b^2$ represent arbitrary positive numbers larger than 0 satisfying $[a^2 \times q^2]/[(p^2+b^2 \times q^2)+a^2 \times q^2+(r^2+q^2)]=0$ to 0.3.

17. The silicon resin liquid composition according to claim 16, wherein each $R^2$ in the formulae (1) and (2) is an alkoxy group or a hydroxyl group.

* * * * *